United States Patent
Bhat et al.

(10) Patent No.: US 10,672,642 B2
(45) Date of Patent: Jun. 2, 2020

(54) SYSTEMS AND METHODS FOR PEDESTAL CONFIGURATION

(71) Applicant: Applied Materials, Inc., Santa Clara, CA (US)

(72) Inventors: Paneendra Prakash Bhat, Bangalore (IN); Mehmet Samir, Mountain View, CA (US); Nikolai Kalnin, Belmont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 113 days.

(21) Appl. No.: 16/049,037

(22) Filed: Jul. 30, 2018

(65) Prior Publication Data
US 2020/0035540 A1 Jan. 30, 2020

Related U.S. Application Data

(60) Provisional application No. 62/702,675, filed on Jul. 24, 2018.

(51) Int. Cl.
*H01L 21/687* (2006.01)
*G01C 9/02* (2006.01)
(Continued)

(52) U.S. Cl.
CPC .......... *H01L 21/68785* (2013.01); *G01C 9/02* (2013.01); *H01L 21/67069* (2013.01);
(Continued)

(58) Field of Classification Search
CPC ......... H01L 21/67253; H01L 21/67748; H01L 21/68764; H01L 21/68707; H01L 21/31116
(Continued)

(56) References Cited

U.S. PATENT DOCUMENTS 2,369,620 A 2/1945 Sullivan et al.
3,401,302 A 9/1968 Thorpe
(Continued)

FOREIGN PATENT DOCUMENTS

CN 1124364 A 6/1996
CN 1847450 A 10/2006
(Continued)

OTHER PUBLICATIONS

International Search Report and Written Opinion dated Oct. 25, 2019 in International Patent Application No. PCT/US2019/040675, all pages.

*Primary Examiner* — Yaritza Guadalupe-McCall
(74) *Attorney, Agent, or Firm* — Kilpatrick Townsend & Stockton LLP

(57) ABSTRACT

Exemplary apparatuses for centering and/or leveling a pedestal of a processing chamber may include a mounting block having a central axis, a set of first gauges mounted on the mounting block, and a set of second gauges mounted on the mounting block. The set of second gauges may be mounted substantially perpendicular to the set of first gauges. The plurality of first gauges may be configured to obtain measurements indicative of a degree of parallelism between a gas distribution plate of the processing chamber and the pedestal. The plurality of second gauges may be configured to obtain measurements indicative of a degree of axial alignment of a ring member of the processing chamber and the pedestal. The exemplary apparatuses may be used for centering and/or leveling the pedestal under vacuum.

20 Claims, 10 Drawing Sheets

(51) Int. Cl.
*H01L 21/67* (2006.01)
*H01J 37/32* (2006.01)
(52) U.S. Cl.
CPC .............. *H01J 37/32724* (2013.01); *H01J 2237/20235* (2013.01); *H01J 2237/20292* (2013.01)
(58) Field of Classification Search
USPC .......................................................... 33/301
See application file for complete search history.

(56) References Cited

U.S. PATENT DOCUMENTS

| | | |
|---|---|---|
| 3,451,840 A | 6/1969 | Hough |
| 3,537,474 A | 11/1970 | Rohrer |
| 3,756,511 A | 9/1973 | Shinroku |
| 3,937,857 A | 2/1976 | Brummett et al. |
| 3,969,077 A | 7/1976 | Hill |
| 4,006,047 A | 2/1977 | Brummett et al. |
| 4,190,488 A | 2/1980 | Winters |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,361,441 A | 11/1982 | Tylko |
| 4,364,803 A | 12/1982 | Nidola et al. |
| 4,368,223 A | 1/1983 | Kobayashi et al. |
| 4,374,698 A | 2/1983 | Sanders et al. |
| 4,397,812 A | 8/1983 | Mallory, Jr. |
| 4,468,413 A | 8/1984 | Bachmann |
| 4,503,807 A | 3/1985 | Nakayama et al. |
| 4,565,601 A | 1/1986 | Kakehi et al. |
| 4,579,618 A | 4/1986 | Celestino et al. |
| 4,585,920 A | 4/1986 | Hoog et al. |
| 4,600,464 A | 7/1986 | Desliets et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,668,335 A | 5/1987 | Mockler |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,792,378 A | 12/1988 | Rose et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,857,140 A | 8/1989 | Loewenstein |
| 4,867,841 A | 9/1989 | Loewenstein et al. |
| 4,904,621 A | 2/1990 | Lowenstein et al. |
| 4,913,929 A | 4/1990 | Moslehi et al. |
| 4,919,750 A | 4/1990 | Bausmith et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,987,856 A | 1/1991 | Hey et al. |
| 4,991,542 A | 2/1991 | Kohmura et al. |
| 4,992,136 A | 2/1991 | Tachi et al. |
| 4,993,358 A | 2/1991 | Mahawili |
| 4,994,404 A | 2/1991 | Sheng et al. |
| 5,000,113 A | 3/1991 | Wang et al. |
| 5,006,192 A | 4/1991 | Deguchi |
| 5,010,842 A | 4/1991 | Oda et al. |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,069,938 A | 12/1991 | Lorimer et al. |
| 5,074,456 A | 12/1991 | Degner et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,200,016 A | 4/1993 | Namose |
| 5,203,911 A | 4/1993 | Sricharoenchalkit et al. |
| 5,215,787 A | 6/1993 | Homma |
| 5,217,559 A | 6/1993 | Moslehi et al. |
| 5,221,427 A | 6/1993 | Koinuma et al. |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,269,881 A | 12/1993 | Sekiya |
| 5,270,125 A | 12/1993 | America et al. |
| 5,271,972 A | 12/1993 | Kwok et al. |
| 5,275,977 A | 1/1994 | Otsubo et al. |
| 5,277,750 A | 1/1994 | Wolgang |
| 5,279,669 A | 1/1994 | Lee |
| 5,279,865 A | 1/1994 | Chebi et al. |
| 5,288,518 A | 2/1994 | Homma |
| 5,290,382 A | 3/1994 | Zarowin et al. |
| 5,290,383 A | 3/1994 | Koshimizu |
| 5,292,370 A | 3/1994 | Tsai et al. |
| 5,292,682 A | 3/1994 | Stevens et al. |
| 5,300,463 A | 4/1994 | Cathey et al. |
| 5,302,233 A | 4/1994 | Kim et al. |
| 5,304,250 A | 4/1994 | Sameshima et al. |
| 5,306,530 A | 4/1994 | Strongin et al. |
| 5,314,724 A | 5/1994 | Tsukune et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,366,585 A | 11/1994 | Robertson et al. |
| 5,368,897 A | 11/1994 | Kurihara et al. |
| 5,378,316 A | 1/1995 | Franke et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,169 A | 9/1995 | Corbett, III et al. |
| 5,451,259 A | 9/1995 | Krogh |

(56) References Cited

U.S. PATENT DOCUMENTS

| | | | |
|---|---|---|---|
| 5,454,170 A * | 10/1995 | Cook | B23Q 17/22 33/533 |
| 5,464,499 A | 11/1995 | Moslehi | |
| 5,468,342 A | 11/1995 | Nulty et al. | |
| 5,474,589 A | 12/1995 | Ohga et al. | |
| 5,478,403 A | 12/1995 | Shinigawa et al. | |
| 5,478,462 A | 12/1995 | Walsh | |
| 5,483,920 A | 1/1996 | Pryor | |
| 5,494,494 A | 2/1996 | Mizuno et al. | |
| 5,500,249 A | 3/1996 | Telford et al. | |
| 5,505,816 A | 4/1996 | Barnes et al. | |
| 5,510,216 A | 4/1996 | Calabrese et al. | |
| 5,516,367 A | 5/1996 | Lei et al. | |
| 5,518,962 A | 5/1996 | Murao | |
| 5,531,835 A | 7/1996 | Fodor et al. | |
| 5,534,070 A | 7/1996 | Okamura et al. | |
| 5,536,360 A | 7/1996 | Nguyen et al. | |
| 5,549,780 A | 8/1996 | Koinuma et al. | |
| 5,556,521 A | 9/1996 | Ghanbari | |
| 5,558,717 A | 9/1996 | Zhao et al. | |
| 5,560,779 A | 10/1996 | Knowles et al. | |
| 5,563,105 A | 10/1996 | Dobuzinsky et al. | |
| 5,567,243 A | 10/1996 | Foster et al. | |
| 5,571,576 A | 11/1996 | Qian et al. | |
| 5,575,853 A | 11/1996 | Arami et al. | |
| 5,578,130 A | 11/1996 | Hayashi et al. | |
| 5,578,161 A | 11/1996 | Auda | |
| 5,580,385 A | 12/1996 | Paranjpe et al. | |
| 5,580,421 A | 12/1996 | Hiatt et al. | |
| 5,591,269 A | 1/1997 | Arami et al. | |
| 5,592,358 A | 1/1997 | Shamouilian | |
| 5,595,606 A | 1/1997 | Fujikawa et al. | |
| 5,597,439 A | 1/1997 | Salzman | |
| 5,599,740 A | 2/1997 | Jang et al. | |
| 5,614,055 A | 3/1997 | Fairbairn et al. | |
| 5,616,518 A | 4/1997 | Foo et al. | |
| 5,624,582 A | 4/1997 | Cain | |
| 5,626,922 A | 5/1997 | Miyanaga et al. | |
| 5,628,829 A | 5/1997 | Foster et al. | |
| 5,635,086 A | 6/1997 | Warren, Jr. | |
| 5,645,645 A | 7/1997 | Zhang et al. | |
| 5,648,125 A | 7/1997 | Cane | |
| 5,648,175 A | 7/1997 | Russell et al. | |
| 5,656,093 A | 8/1997 | Burkhart et al. | |
| 5,660,957 A | 8/1997 | Chou et al. | |
| 5,661,093 A | 8/1997 | Ravi et al. | |
| 5,670,066 A | 9/1997 | Barnes et al. | |
| 5,674,787 A | 10/1997 | Zhao et al. | |
| 5,676,758 A | 10/1997 | Hasgawa et al. | |
| 5,679,606 A | 10/1997 | Wang et al. | |
| 5,685,946 A | 11/1997 | Fathauer et al. | |
| 5,688,331 A | 11/1997 | Aruga et al. | |
| 5,695,810 A | 12/1997 | Dubin et al. | |
| 5,712,185 A | 1/1998 | Tsai et al. | |
| 5,716,500 A | 2/1998 | Bardos et al. | |
| 5,716,506 A | 2/1998 | Maclay et al. | |
| 5,719,085 A | 2/1998 | Moon et al. | |
| 5,733,816 A | 3/1998 | Iyer et al. | |
| 5,747,373 A | 5/1998 | Yu | |
| 5,753,886 A | 5/1998 | Iwamura et al. | |
| 5,755,859 A | 5/1998 | Brusic et al. | |
| 5,756,400 A | 5/1998 | Ye et al. | |
| 5,756,402 A | 5/1998 | Jimbo et al. | |
| 5,772,770 A | 6/1998 | Suda et al. | |
| 5,781,693 A | 7/1998 | Ballance et al. | |
| 5,786,276 A | 7/1998 | Brooks et al. | |
| 5,788,825 A | 8/1998 | Park et al. | |
| 5,789,300 A | 8/1998 | Fulford | |
| 5,792,376 A | 8/1998 | Kanai et al. | |
| 5,800,686 A | 9/1998 | Littau et al. | |
| 5,804,259 A | 9/1998 | Robles | |
| 5,812,403 A | 9/1998 | Fong et al. | |
| 5,814,238 A | 9/1998 | Ashby et al. | |
| 5,814,365 A | 9/1998 | Mahawill | |
| 5,820,723 A | 10/1998 | Benjamin et al. | |
| 5,824,599 A | 10/1998 | Schacham-Diamand et al. | |
| 5,830,805 A | 11/1998 | Schacham-Diamand et al. | |
| 5,835,334 A | 11/1998 | McMillin et al. | |
| 5,843,538 A | 12/1998 | Ehrsam et al. | |
| 5,843,847 A | 12/1998 | Pu et al. | |
| 5,844,195 A | 12/1998 | Fairbairn et al. | |
| 5,846,332 A | 12/1998 | Zhao et al. | |
| 5,846,373 A | 12/1998 | Pirkle et al. | |
| 5,846,375 A | 12/1998 | Gilchrist et al. | |
| 5,846,598 A | 12/1998 | Semkow et al. | |
| 5,849,639 A | 12/1998 | Molloy et al. | |
| 5,850,105 A | 12/1998 | Dawson et al. | |
| 5,855,681 A | 1/1999 | Maydan et al. | |
| 5,855,685 A | 1/1999 | Tobe et al. | |
| 5,856,240 A | 1/1999 | Sinha et al. | |
| 5,858,876 A | 1/1999 | Chew | |
| 5,863,376 A | 1/1999 | Wicker | |
| 5,865,896 A | 2/1999 | Nowak | |
| 5,866,483 A | 2/1999 | Shiau et al. | |
| 5,868,897 A | 2/1999 | Ohkawa | |
| 5,872,052 A | 2/1999 | Iyer | |
| 5,872,058 A | 2/1999 | Van Cleemput et al. | |
| 5,882,424 A | 3/1999 | Taylor et al. | |
| 5,882,786 A | 3/1999 | Nassau et al. | |
| 5,883,012 A | 3/1999 | Chiou | |
| 5,885,404 A | 3/1999 | Kim et al. | |
| 5,885,749 A | 3/1999 | Huggins et al. | |
| 5,888,906 A | 3/1999 | Sandhu et al. | |
| 5,891,349 A | 4/1999 | Tobe et al. | |
| 5,891,513 A | 4/1999 | Dubin et al. | |
| 5,897,751 A | 4/1999 | Makowiecki | |
| 5,899,752 A | 5/1999 | Hey et al. | |
| 5,900,163 A | 5/1999 | Yi et al. | |
| 5,904,827 A | 5/1999 | Reynolds | |
| 5,907,790 A | 5/1999 | Kellam | |
| 5,910,340 A | 6/1999 | Uchida et al. | |
| 5,913,147 A | 6/1999 | Dubin et al. | |
| 5,913,978 A | 6/1999 | Kato et al. | |
| 5,915,190 A | 6/1999 | Pirkle | |
| 5,918,116 A | 6/1999 | Chittipeddi | |
| 5,919,332 A | 7/1999 | Koshiishi et al. | |
| 5,920,792 A | 7/1999 | Lin | |
| 5,926,737 A | 7/1999 | Ameen et al. | |
| 5,928,528 A | 7/1999 | Kubota et al. | |
| 5,932,077 A | 8/1999 | Reynolds | |
| 5,933,757 A | 8/1999 | Yoshikawa et al. | |
| 5,935,334 A | 8/1999 | Fong et al. | |
| 5,935,340 A | 8/1999 | Xia et al. | |
| 5,937,323 A | 8/1999 | Orczyk et al. | |
| 5,939,831 A | 8/1999 | Fong et al. | |
| 5,942,075 A | 8/1999 | Nagahata et al. | |
| 5,944,049 A | 8/1999 | Beyer et al. | |
| 5,944,902 A | 8/1999 | Redeker et al. | |
| 5,948,702 A | 9/1999 | Rotondaro | |
| 5,951,601 A | 9/1999 | Lesinski et al. | |
| 5,951,776 A | 9/1999 | Selyutin et al. | |
| 5,951,896 A | 9/1999 | Mahawill | |
| 5,953,591 A | 9/1999 | Ishihara et al. | |
| 5,953,635 A | 9/1999 | Andideh | |
| 5,963,840 A | 10/1999 | Xia et al. | |
| 5,968,379 A | 10/1999 | Zhao et al. | |
| 5,968,587 A | 10/1999 | Frankel et al. | |
| 5,968,610 A | 10/1999 | Liu et al. | |
| 5,969,422 A | 10/1999 | Ting et al. | |
| 5,976,327 A | 11/1999 | Tanaka | |
| 5,982,100 A | 11/1999 | Ghanbari | |
| 5,990,000 A | 11/1999 | Hong et al. | |
| 5,990,013 A | 11/1999 | Berenguer et al. | |
| 5,993,916 A | 11/1999 | Zhao et al. | |
| 5,994,209 A | 11/1999 | Yieh et al. | |
| 5,997,649 A | 12/1999 | Hillman | |
| 5,997,721 A | 12/1999 | Limbach et al. | |
| 5,997,962 A | 12/1999 | Ogasawara et al. | |
| 6,004,884 A | 12/1999 | Abraham | |
| 6,007,635 A | 12/1999 | Mahawill | |
| 6,007,785 A | 12/1999 | Liou | |
| 6,010,962 A | 1/2000 | Liu et al. | |
| 6,013,191 A | 1/2000 | Nasser-Faili et al. | |
| 6,013,584 A | 1/2000 | M'Saad | |

(56) References Cited

U.S. PATENT DOCUMENTS

| | | |
|---|---|---|
| 6,015,724 A | 1/2000 | Yamazaki et al. |
| 6,015,747 A | 1/2000 | Lopatin et al. |
| 6,017,414 A | 1/2000 | Koemtzopoulos et al. |
| 6,019,848 A | 2/2000 | Kiyama et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,036,878 A | 3/2000 | Collins et al. |
| 6,037,018 A | 3/2000 | Jang et al. |
| 6,037,266 A | 3/2000 | Tao et al. |
| 6,039,834 A | 3/2000 | Tanaka et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,065,425 A | 5/2000 | Takaki et al. |
| 6,072,147 A | 6/2000 | Koshiishi |
| 6,072,227 A | 6/2000 | Yau et al. |
| 6,074,512 A | 6/2000 | Collins et al. |
| 6,074,514 A | 6/2000 | Bjorkman et al. |
| 6,077,384 A | 6/2000 | Collins et al. |
| 6,077,386 A | 6/2000 | Smith, Jr. et al. |
| 6,077,780 A | 6/2000 | Dubin |
| 6,079,356 A | 6/2000 | Umotoy et al. |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,114,216 A | 9/2000 | Yieh et al. |
| 6,117,245 A | 9/2000 | Mandrekar et al. |
| 6,120,640 A | 9/2000 | Shih et al. |
| 6,124,003 A | 9/2000 | Mikami et al. |
| 6,126,753 A | 10/2000 | Shinriki et al. |
| 6,132,512 A | 10/2000 | Horie et al. |
| 6,136,163 A | 10/2000 | Cheung et al. |
| 6,136,165 A | 10/2000 | Moslehi et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,148,761 A | 11/2000 | Majewski et al. |
| 6,149,828 A | 11/2000 | Vaartstra |
| 6,150,628 A | 11/2000 | Smith et al. |
| 6,153,935 A | 11/2000 | Edelstein et al. |
| 6,161,500 A | 12/2000 | Kopacz et al. |
| 6,161,576 A | 12/2000 | Maher et al. |
| 6,162,302 A | 12/2000 | Raghavan et al. |
| 6,162,370 A | 12/2000 | Hackett et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,170,429 B1 | 1/2001 | Schoepp |
| 6,171,661 B1 | 1/2001 | Zheng et al. |
| 6,174,450 B1 | 1/2001 | Patrick et al. |
| 6,174,810 B1 | 1/2001 | Patrick et al. |
| 6,174,812 B1 | 1/2001 | Hsuing et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,182,603 B1 | 2/2001 | Shang et al. |
| 6,184,121 B1 | 2/2001 | Buchwalter et al. |
| 6,184,489 B1 | 2/2001 | Ito et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,198,616 B1 | 3/2001 | Dahimene et al. |
| 6,200,412 B1 | 3/2001 | Kilgore et al. |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak |
| 6,225,745 B1 | 5/2001 | Srivastava |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,197,151 B1 | 6/2001 | Kaji et al. |
| 6,241,845 B1 | 6/2001 | Gadgil et al. |
| 6,242,349 B1 | 6/2001 | Nogami et al. |
| 6,242,360 B1 | 6/2001 | Fischer et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,170 B1 | 7/2001 | Somekh et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,267,074 B1 | 7/2001 | Okumura |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,291,282 B1 | 9/2001 | Wilk et al. |
| 6,291,348 B1 | 9/2001 | Lopatin et al. |
| 6,302,964 B1 | 10/2001 | Umotoy et al. |
| 6,303,044 B1 | 10/2001 | Koemtzopoulos |
| 6,303,418 B1 | 10/2001 | Cha et al. |
| 6,306,246 B1 | 10/2001 | Melvin et al. |
| 6,306,772 B1 | 10/2001 | Lin |
| 6,308,654 B1 | 10/2001 | Schneider et al. |
| 6,308,776 B1 | 10/2001 | Sloan |
| 6,310,755 B1 | 10/2001 | Busato et al. |
| 6,312,554 B1 | 11/2001 | Ye |
| 6,312,995 B1 | 11/2001 | Yu |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawili |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |

(56) References Cited

U.S. PATENT DOCUMENTS

| | | |
|---|---|---|
| 6,358,827 B1 | 3/2002 | Chen et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno |
| 6,427,623 B2 | 8/2002 | Ko |
| 6,429,465 B1 | 8/2002 | Yagi et al. |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,437,512 B1 | 8/2002 | Chen et al. |
| 6,440,863 B1 | 8/2002 | Tsai et al. |
| 6,441,492 B1 | 8/2002 | Cunningham |
| 6,444,083 B1 | 9/2002 | Steger et al. |
| 6,446,572 B1 | 9/2002 | Brcka |
| 6,447,636 B1 | 9/2002 | Qian et al. |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,462,372 B1 | 10/2002 | Xia et al. |
| 6,463,782 B1 * | 10/2002 | Shen .................. B25J 9/1692 73/1.79 |
| 6,465,051 B1 | 10/2002 | Sahin et al. |
| 6,465,350 B1 | 10/2002 | Taylor et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,283 B1 | 1/2003 | Thomas |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,531,069 B1 | 3/2003 | Srivastava et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,661 B1 | 5/2003 | Nguyen |
| 6,565,729 B2 | 5/2003 | Chen et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,602,806 B1 | 8/2003 | Xia et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,575 B1 | 10/2003 | Xia et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,656,848 B1 | 12/2003 | Scanlan et al. |
| 6,663,715 B1 | 12/2003 | Yuda et al. |
| 6,673,200 B1 | 1/2004 | Gu et al. |
| 6,677,242 B1 | 1/2004 | Liu et al. |
| 6,679,981 B1 | 1/2004 | Pan et al. |
| 6,688,375 B1 | 2/2004 | Turner |
| 6,692,903 B2 | 2/2004 | Chen et al. |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,736,147 B2 | 5/2004 | Satoh et al. |
| 6,736,987 B1 | 5/2004 | Cho |
| 6,740,247 B1 | 5/2004 | Han et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fisher |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,815,633 B1 | 11/2004 | Chen et al. |
| 6,818,561 B1 | 11/2004 | Sonderman |
| 6,821,571 B2 | 11/2004 | Huang |
| 6,823,589 B2 | 11/2004 | White et al. |
| 6,828,241 B2 | 12/2004 | Kholodenko et al. |
| 6,830,624 B2 | 12/2004 | Janakiraman et al. |
| 6,835,995 B2 | 12/2004 | Li |
| 6,846,401 B2 | 1/2005 | Wijenberg et al. |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,852,584 B1 | 2/2005 | Chen et al. |
| 6,853,533 B2 | 2/2005 | Parkhe et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |

(56) References Cited

U.S. PATENT DOCUMENTS

| | | |
|---|---|---|
| 6,916,399 B1 | 7/2005 | Rozenzon et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuel et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,969,619 B1 | 11/2005 | Winniczek |
| 6,972,840 B1 | 12/2005 | Gu et al. |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,037,846 B2 | 5/2006 | Srivastava et al. |
| 7,049,200 B2 | 5/2006 | Arghavani et al. |
| 7,049,244 B2 | 5/2006 | Becker et al. |
| 7,052,553 B1 | 5/2006 | Shih et al. |
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,138,767 B2 | 11/2006 | Chen et al. |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,256,370 B2 | 8/2007 | Guiver |
| 7,274,004 B2 | 9/2007 | Benjamin et al. |
| 7,288,482 B2 | 10/2007 | Panda et al. |
| 7,291,360 B2 | 11/2007 | Hanawa et al. |
| 7,297,894 B1 | 11/2007 | Tsukamoto |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,361,865 B2 | 4/2008 | Maki et al. |
| 7,364,956 B2 | 4/2008 | Saito |
| 7,365,016 B2 | 4/2008 | Ouellet et al. |
| 7,396,480 B2 | 7/2008 | Kao et al. |
| 7,396,773 B1 | 7/2008 | Blosse et al. |
| 7,416,989 B1 | 8/2008 | Liu et al. |
| 7,465,358 B2 | 12/2008 | Weidman et al. |
| 7,465,953 B1 | 12/2008 | Koh et al. |
| 7,468,319 B2 | 12/2008 | Lee |
| 7,479,303 B2 | 1/2009 | Byun et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,500,445 B2 | 3/2009 | Zhao et al. |
| 7,504,040 B2 | 3/2009 | Lijima et al. |
| 7,513,214 B2 | 4/2009 | Okumura et al. |
| 7,520,957 B2 | 4/2009 | Kao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,658,799 B2 | 2/2010 | Ishikawa et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,780,790 B2 | 8/2010 | Nogami |
| 7,785,672 B2 | 8/2010 | Choi et al. |
| 7,790,634 B2 | 9/2010 | Munro et al. |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,867,926 B2 | 1/2011 | Satoh et al. |
| 7,906,818 B2 | 3/2011 | Pekny |
| 7,915,139 B1 | 3/2011 | Lang et al. |
| 7,922,863 B2 | 4/2011 | Ripley |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,977,249 B1 | 7/2011 | Liu |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |
| 8,119,530 B2 | 2/2012 | Hori et al. |
| 8,133,349 B1 | 3/2012 | Panagopoulos |
| 8,173,228 B2 | 5/2012 | Choi et al. |
| 8,183,134 B2 | 5/2012 | Wu |
| 8,187,486 B1 | 5/2012 | Liu et al. |
| 8,199,454 B2 | 6/2012 | Koyama et al. |
| 8,211,808 B2 | 7/2012 | Sapre et al. |
| 8,216,486 B2 | 7/2012 | Dhindsa |
| 8,222,128 B2 | 7/2012 | Sasaki et al. |
| 8,252,194 B2 | 8/2012 | Kiehlbauch et al. |
| 8,272,346 B2 | 9/2012 | Bettencourt et al. |
| 8,295,089 B2 | 10/2012 | Jeong et al. |
| 8,298,627 B2 | 10/2012 | Minami et al. |
| 8,298,959 B2 | 10/2012 | Cheshire |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,329,262 B2 | 12/2012 | Miller et al. |
| 8,336,188 B2 | 12/2012 | Monteen |
| 8,343,306 B2 | 1/2013 | Tanaka et al. |
| 8,357,435 B2 | 1/2013 | Lubomirsky |
| 8,361,892 B2 | 1/2013 | Tam et al. |
| 8,368,308 B2 | 2/2013 | Banna et al. |
| 8,390,980 B2 | 3/2013 | Sansoni et al. |
| 8,398,777 B2 * | 3/2013 | Collins ............... C30B 25/12 |
| | | 118/729 |
| 8,427,067 B2 | 4/2013 | Espiau et al. |
| 8,435,902 B2 | 5/2013 | Tang et al. |
| 8,440,523 B1 | 5/2013 | Guillorn et al. |
| 8,466,073 B2 | 6/2013 | Wang et al. |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,528,889 B2 | 9/2013 | Sansoni et al. |
| 8,540,844 B2 | 9/2013 | Hudson et al. |
| 8,551,891 B2 | 10/2013 | Liang |
| 8,573,152 B2 | 11/2013 | De La Llera |
| 8,622,021 B2 | 1/2014 | Taylor et al. |
| 8,623,471 B2 | 1/2014 | Tyler et al. |
| 8,633,423 B2 | 1/2014 | Lin et al. |
| 8,642,481 B2 | 2/2014 | Wang et al. |
| 8,652,298 B2 | 2/2014 | Dhindsa et al. |
| 8,668,836 B2 | 3/2014 | Mizukami et al. |
| 8,679,354 B2 | 3/2014 | O'Hara |
| 8,679,982 B2 | 3/2014 | Wang et al. |
| 8,679,983 B2 | 3/2014 | Wang et al. |

(56) References Cited

U.S. PATENT DOCUMENTS

| | | |
|---|---|---|
| 8,691,023 B2 | 4/2014 | Bao et al. |
| 8,702,902 B2 | 4/2014 | Blom et al. |
| 8,741,778 B2 | 6/2014 | Yang et al. |
| 8,747,610 B2 | 6/2014 | Chen et al. |
| 8,747,680 B1 | 6/2014 | Deshpande |
| 8,748,322 B1 | 6/2014 | Fung et al. |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,802,572 B2 | 8/2014 | Nemani et al. |
| 8,808,563 B2 | 8/2014 | Wang et al. |
| 8,815,720 B2 | 8/2014 | Godet et al. |
| 8,835,316 B2 | 9/2014 | Yin et al. |
| 8,846,163 B2 | 9/2014 | Kao et al. |
| 8,869,742 B2 | 10/2014 | Dhindsa |
| 8,871,651 B1 | 10/2014 | Choi et al. |
| 8,888,087 B2 | 11/2014 | Okabe et al. |
| 8,894,767 B2 | 11/2014 | Goradia et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,932,947 B1 | 1/2015 | Han et al. |
| 8,937,017 B2 | 1/2015 | Cheshire et al. |
| 8,945,414 B1 | 2/2015 | Su et al. |
| 8,946,665 B2 | 2/2015 | Shim et al. |
| 8,946,828 B2 | 2/2015 | Sun et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,970,114 B2 | 3/2015 | Busche et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,656 B2 | 4/2015 | Jirstrom et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,068,265 B2 | 6/2015 | Lubomirsky et al. |
| 9,072,158 B2 | 6/2015 | Ikeda et al. |
| 9,093,371 B2 | 7/2015 | Wang et al. |
| 9,093,389 B2 | 7/2015 | Nemani |
| 9,093,390 B2 | 7/2015 | Wang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,783 B2 | 10/2015 | Nemani et al. |
| 9,165,786 B1 | 10/2015 | Purayath et al. |
| 9,184,055 B2 | 11/2015 | Wang et al. |
| 9,190,290 B2 | 11/2015 | Xue et al. |
| 9,190,293 B2 | 11/2015 | Wang et al. |
| 9,190,302 B2 | 11/2015 | Ni |
| 9,202,708 B1 | 12/2015 | Chen et al. |
| 9,209,012 B2 | 12/2015 | Chen et al. |
| 9,236,265 B2 | 1/2016 | Korolik et al. |
| 9,236,266 B2 | 1/2016 | Zhang et al. |
| 9,240,315 B1 | 1/2016 | Hsieh et al. |
| 9,245,762 B2 | 1/2016 | Zhang et al. |
| 9,263,278 B2 | 2/2016 | Purayath et al. |
| 9,267,739 B2 | 2/2016 | Chen et al. |
| 9,269,590 B2 | 2/2016 | Luere et al. |
| 9,275,834 B1 | 3/2016 | Park et al. |
| 9,281,384 B2 | 3/2016 | Takeguchi |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,539 B2 | 3/2016 | Makhratchev |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhang et al. |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,362,163 B2 | 6/2016 | Danek et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,961 B2 | 7/2016 | Arghavani et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,412,752 B1 | 8/2016 | Yeh et al. |
| 9,418,858 B2 | 8/2016 | Wang et al. |
| 9,425,041 B2 | 8/2016 | Berry et al. |
| 9,425,057 B2 | 8/2016 | Cho et al. |
| 9,425,058 B2 | 8/2016 | Kim et al. |
| 9,431,268 B2 | 8/2016 | Lill et al. |
| 9,431,414 B2 | 8/2016 | Jang et al. |
| 9,343,358 B1 | 9/2016 | Montgomery |
| 9,437,451 B2 | 9/2016 | Chen et al. |
| 9,443,749 B2 | 9/2016 | Smith |
| 9,449,843 B1 | 9/2016 | Korolik et al. |
| 9,449,845 B2 | 9/2016 | Liu et al. |
| 9,449,846 B2 | 9/2016 | Liu et al. |
| 9,449,850 B2 | 9/2016 | Wang et al. |
| 9,460,959 B1 | 10/2016 | Xie et al. |
| 9,466,469 B2 | 10/2016 | Khaja |
| 9,472,412 B2 | 10/2016 | Zhang et al. |
| 9,472,417 B2 | 10/2016 | Ingle et al. |
| 9,478,432 B2 | 10/2016 | Chen et al. |
| 9,478,433 B1 | 10/2016 | Zhou et al. |
| 9,478,434 B2 | 10/2016 | Wang et al. |
| 9,493,879 B2 | 11/2016 | Hoinkis et al. |
| 9,496,167 B2 | 11/2016 | Purayath et al. |
| 9,499,898 B2 | 11/2016 | Nguyen et al. |
| 9,502,258 B2 | 11/2016 | Xue et al. |
| 9,508,529 B2 | 11/2016 | Valcore et al. |
| 9,520,303 B2 | 12/2016 | Wang et al. |
| 9,534,724 B2 | 1/2017 | Jiang et al. |
| 9,543,163 B2 | 1/2017 | Ling et al. |
| 9,564,296 B2 | 2/2017 | Kobayashi et al. |
| 9,564,338 B1 | 2/2017 | Zhang et al. |
| 9,576,788 B2 | 2/2017 | Liu et al. |
| 9,576,809 B2 | 2/2017 | Korolik et al. |
| 9,607,856 B2 | 3/2017 | Wang et al. |
| 9,613,822 B2 | 4/2017 | Chen et al. |
| 9,659,753 B2 | 5/2017 | Cho et al. |
| 9,659,791 B2 | 5/2017 | Wang et al. |
| 9,659,792 B2 | 5/2017 | Wang et al. |
| 9,666,449 B2 | 5/2017 | Koval et al. |
| 9,691,645 B2 | 6/2017 | Ayers |
| 9,704,723 B2 | 7/2017 | Wang et al. |
| 9,711,366 B2 | 7/2017 | Ingle et al. |

(56) References Cited

U.S. PATENT DOCUMENTS

| | | |
|---|---|---|
| 9,721,789 B1 | 8/2017 | Yang et al. |
| 9,728,437 B2 | 8/2017 | Tran et al. |
| 9,741,593 B2 | 8/2017 | Benjaminson et al. |
| 9,754,800 B2 | 9/2017 | Zhang et al. |
| 9,768,034 B1 | 9/2017 | Xu et al. |
| 9,773,648 B2 | 9/2017 | Cho et al. |
| 9,773,695 B2 | 9/2017 | Purayath et al. |
| 9,779,956 B1 | 10/2017 | Zhang et al. |
| 9,812,462 B1 | 11/2017 | Pang et al. |
| 9,822,009 B2 | 11/2017 | Kagaya et al. |
| 9,831,097 B2 | 11/2017 | Ingle et al. |
| 9,837,249 B2 | 12/2017 | Kobayashi et al. |
| 9,837,284 B2 | 12/2017 | Chen et al. |
| 9,837,286 B2 | 12/2017 | Yang et al. |
| 9,842,744 B2 | 12/2017 | Zhang et al. |
| 9,865,484 B1 | 1/2018 | Citla et al. |
| 9,881,805 B2 | 1/2018 | Li et al. |
| 9,885,117 B2 | 2/2018 | Lubomirsky et al. |
| 9,887,096 B2 | 2/2018 | Park et al. |
| 9,903,020 B2 | 2/2018 | Kim et al. |
| 9,934,942 B1 | 4/2018 | Lubomirsky |
| 9,941,097 B2 | 4/2018 | Yamazawa |
| 9,947,549 B1 | 4/2018 | Park et al. |
| 9,960,045 B1 | 5/2018 | Purayath et al. |
| 9,966,240 B2 | 5/2018 | Park et al. |
| 9,978,564 B2 | 5/2018 | Liang et al. |
| 9,991,134 B2 | 6/2018 | Wang et al. |
| 10,026,621 B2 | 7/2018 | Ko et al. |
| 10,032,606 B2 | 7/2018 | Yang et al. |
| 10,043,674 B1 | 8/2018 | Korolik et al. |
| 10,043,684 B1 | 8/2018 | Arnepalli et al. |
| 10,049,891 B1 | 8/2018 | Wang et al. |
| 10,062,578 B2 | 8/2018 | Zhang et al. |
| 10,062,579 B2 | 8/2018 | Chen et al. |
| 10,062,585 B2 | 8/2018 | Lubomirsky |
| 10,062,587 B2 | 8/2018 | Chen et al. |
| 10,083,830 B2 | 9/2018 | Seino et al. |
| 10,121,689 B2 * | 11/2018 | Konkola ............ C23C 16/45544 |
| 10,147,620 B2 | 12/2018 | Benjaminson et al. |
| 10,147,736 B2 | 12/2018 | Linuma |
| 10,269,541 B2 | 4/2019 | Stowell et al. |
| 10,319,739 B2 | 6/2019 | Purayath |
| 2001/0003014 A1 | 6/2001 | Yuda |
| 2001/0006093 A1 | 7/2001 | Tabuchi |
| 2001/0008803 A1 | 7/2001 | Takamatsu et al. |
| 2001/0015175 A1 | 8/2001 | Masuda et al. |
| 2001/0015261 A1 | 8/2001 | Kobayashi et al. |
| 2001/0023741 A1 | 9/2001 | Collison et al. |
| 2001/0028093 A1 | 10/2001 | Yamazaki et al. |
| 2001/0028922 A1 | 10/2001 | Sandhu |
| 2001/0029891 A1 | 10/2001 | Oh et al. |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0036706 A1 | 11/2001 | Kitamura |
| 2001/0037856 A1 | 11/2001 | Park |
| 2001/0037941 A1 | 11/2001 | Thompson |
| 2001/0039921 A1 | 11/2001 | Rolfson et al. |
| 2001/0042512 A1 | 11/2001 | Xu et al. |
| 2001/0042799 A1 | 11/2001 | Kim et al. |
| 2001/0045269 A1 | 11/2001 | Yamada |
| 2001/0047760 A1 | 12/2001 | Moslehi |
| 2001/0053585 A1 | 12/2001 | Kikuchi et al. |
| 2001/0053610 A1 | 12/2001 | Athavale |
| 2001/0054381 A1 | 12/2001 | Umotoy et al. |
| 2001/0054387 A1 | 12/2001 | Frankel et al. |
| 2002/0000202 A1 | 1/2002 | Yuda et al. |
| 2002/0001778 A1 | 1/2002 | Latchford et al. |
| 2002/0009560 A1 | 1/2002 | Ozono |
| 2002/0009885 A1 | 1/2002 | Brankner et al. |
| 2002/0011210 A1 | 1/2002 | Satoh et al. |
| 2002/0011214 A1 | 1/2002 | Kamarehi et al. |
| 2002/0016080 A1 | 2/2002 | Khan et al. |
| 2002/0016085 A1 | 2/2002 | Huang et al. |
| 2002/0020429 A1 | 2/2002 | Selbrede et al. |
| 2002/0023899 A1 | 2/2002 | Khater et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi |
| 2002/0042192 A1 | 4/2002 | Tanaka et al. |
| 2002/0043690 A1 | 4/2002 | Doyle et al. |
| 2002/0045966 A1 | 4/2002 | Lee et al. |
| 2002/0046991 A1 | 4/2002 | Smith et al. |
| 2002/0048963 A1 | 4/2002 | Campbell et al. |
| 2002/0054962 A1 | 5/2002 | Huang |
| 2002/0062954 A1 | 5/2002 | Getchel et al. |
| 2002/0069820 A1 | 6/2002 | Yudovsky |
| 2002/0070414 A1 | 6/2002 | Drescher et al. |
| 2002/0073925 A1 | 6/2002 | Noble et al. |
| 2002/0074573 A1 | 6/2002 | Takeuchi et al. |
| 2002/0075624 A1 | 6/2002 | Wang et al. |
| 2002/0086501 A1 | 7/2002 | O'Donnell et al. |
| 2002/0090781 A1 | 7/2002 | Skotnicki et al. |
| 2002/0090835 A1 | 7/2002 | Chakravarti et al. |
| 2002/0094378 A1 | 7/2002 | O'Donnell |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0170678 A1 | 11/2002 | Hayashi et al. |
| 2002/0177322 A1 | 11/2002 | Li et al. |
| 2002/0179248 A1 | 12/2002 | Kabansky et al. |
| 2002/0182878 A1 | 12/2002 | Hirose et al. |
| 2002/0185226 A1 | 12/2002 | Lea et al. |
| 2002/0187280 A1 | 12/2002 | Johnson et al. |
| 2002/0187655 A1 | 12/2002 | Tan et al. |
| 2002/0197823 A1 | 12/2002 | Yoo et al. |
| 2003/0000647 A1 | 1/2003 | Yudovsky et al. |
| 2003/0003757 A1 | 1/2003 | Nallan et al. |
| 2003/0007910 A1 | 1/2003 | Lazarovich et al. |
| 2003/0010645 A1 | 1/2003 | Ting et al. |
| 2003/0015515 A1 | 1/2003 | Ito et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0031905 A1 | 2/2003 | Saito et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0066482 A1 | 4/2003 | Pokharna et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077857 A1 | 4/2003 | Xia et al. |
| 2003/0077909 A1 | 4/2003 | Jiwari |
| 2003/0079686 A1 | 5/2003 | Chen et al. |
| 2003/0087488 A1 | 5/2003 | Fink |
| 2003/0087531 A1 | 5/2003 | Kang et al. |
| 2003/0091938 A1 | 5/2003 | Fairbairn et al. |
| 2003/0094134 A1 | 5/2003 | Minami et al. |
| 2003/0098125 A1 | 5/2003 | An |
| 2003/0101938 A1 | 6/2003 | Ronsse et al. |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0119328 A1 | 6/2003 | Fujisato |
| 2003/0121608 A1 | 7/2003 | Chen et al. |
| 2003/0121609 A1 | 7/2003 | Ohmi et al. |

(56) References Cited

U.S. PATENT DOCUMENTS

| | | |
|---|---|---|
| 2003/0124465 A1 | 7/2003 | Lee et al. |
| 2003/0124842 A1 | 7/2003 | Hytros et al. |
| 2003/0127049 A1 | 7/2003 | Han et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0136520 A1 | 7/2003 | Yudovsky et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0150530 A1 | 8/2003 | Lin et al. |
| 2003/0152691 A1 | 8/2003 | Baude |
| 2003/0159307 A1 | 8/2003 | Sago et al. |
| 2003/0164226 A1 | 9/2003 | Kanno et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe et al. |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0196760 A1 | 10/2003 | Tyler et al. |
| 2003/0199170 A1 | 10/2003 | Li |
| 2003/0200929 A1 | 10/2003 | Otsuki |
| 2003/0201764 A1 | 10/2003 | Jafari et al. |
| 2003/0205329 A1 | 11/2003 | Gujer et al. |
| 2003/0205479 A1 | 11/2003 | Lin et al. |
| 2003/0209323 A1 | 11/2003 | Yokogaki et al. |
| 2003/0215570 A1 | 11/2003 | Seutter et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2004/0002221 A1 | 1/2004 | O'Donnell et al. |
| 2004/0003828 A1 | 1/2004 | Jackson |
| 2004/0005726 A1 | 1/2004 | Huang |
| 2004/0018304 A1 | 1/2004 | Chung et al. |
| 2004/0020801 A1 | 2/2004 | Solling |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058070 A1 | 3/2004 | Takeuchi et al. |
| 2004/0058293 A1 | 3/2004 | Nguyen et al. |
| 2004/0060514 A1 | 4/2004 | Janakiraman et al. |
| 2004/0061447 A1 | 4/2004 | Saigusa et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099285 A1 | 5/2004 | Wange et al. |
| 2004/0099378 A1 | 5/2004 | Kim et al. |
| 2004/0101667 A1 | 5/2004 | O'Loughlin et al. |
| 2004/0103844 A1 | 6/2004 | Chou et al. |
| 2004/0107908 A1 | 6/2004 | Collins et al. |
| 2004/0108067 A1 | 6/2004 | Fischione et al. |
| 2004/0108068 A1 | 6/2004 | Senzaki et al. |
| 2004/0115876 A1 | 6/2004 | Goundar et al. |
| 2004/0115947 A1 | 6/2004 | Fink et al. |
| 2004/0124280 A1 | 7/2004 | Shih et al. |
| 2004/0129671 A1 | 7/2004 | Ji et al. |
| 2004/0137161 A1 | 7/2004 | Segawa et al. |
| 2004/0140053 A1 | 7/2004 | Srivastava et al. |
| 2004/0144311 A1 | 7/2004 | Chen et al. |
| 2004/0144490 A1 | 7/2004 | Zhao et al. |
| 2004/0147126 A1 | 7/2004 | Yamashita et al. |
| 2004/0149223 A1 | 8/2004 | Collison et al. |
| 2004/0149387 A1 | 8/2004 | Kim et al. |
| 2004/0149394 A1 | 8/2004 | Doan et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0163601 A1 | 8/2004 | Kadotani et al. |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0187787 A1 | 9/2004 | Dawson |
| 2004/0192032 A1 | 9/2004 | Ohmori et al. |
| 2004/0194799 A1 | 10/2004 | Kim et al. |
| 2004/0195208 A1 | 10/2004 | Pavel et al. |
| 2004/0195216 A1 | 10/2004 | Strang |
| 2004/0200499 A1 | 10/2004 | Harvey |
| 2004/0201843 A1* | 10/2004 | Glenn ............... H01L 21/67265 356/244 |
| 2004/0211357 A1 | 10/2004 | Gadgil et al. |
| 2004/0219723 A1 | 11/2004 | Peng et al. |
| 2004/0219737 A1 | 11/2004 | Quon |
| 2004/0219789 A1 | 11/2004 | Wood et al. |
| 2004/0221809 A1 | 11/2004 | Ohmi et al. |
| 2004/0231706 A1 | 11/2004 | Bhatnagar et al. |
| 2004/0237897 A1 | 12/2004 | Hanawa et al. |
| 2004/0238123 A1 | 12/2004 | Becknell et al. |
| 2004/0259367 A1 | 12/2004 | Constantine et al. |
| 2004/0263827 A1 | 12/2004 | Xu |
| 2005/0000430 A1 | 1/2005 | Jang et al. |
| 2005/0000432 A1 | 1/2005 | Keller et al. |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0039679 A1 | 2/2005 | Kleshock |
| 2005/0051094 A1 | 3/2005 | Schaepkens et al. |
| 2005/0054167 A1 | 3/2005 | Choi et al. |
| 2005/0056218 A1 | 3/2005 | Sun et al. |
| 2005/0073051 A1 | 4/2005 | Yamamoto et al. |
| 2005/0079706 A1 | 4/2005 | Kumar et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0103267 A1 | 5/2005 | Hur et al. |
| 2005/0105991 A1 | 5/2005 | Hofmeister et al. |
| 2005/0109279 A1 | 5/2005 | Suzuki |
| 2005/0112876 A1 | 5/2005 | Wu |
| 2005/0112901 A1 | 5/2005 | Ji et al. |
| 2005/0123690 A1 | 6/2005 | Derderian et al. |
| 2005/0133849 A1 | 6/2005 | Jeon et al. |
| 2005/0136188 A1 | 6/2005 | Chang |
| 2005/0145341 A1 | 7/2005 | Suzuki |
| 2005/0164479 A1 | 7/2005 | Perng et al. |
| 2005/0167394 A1 | 8/2005 | Liu et al. |
| 2005/0176258 A1 | 8/2005 | Hirose et al. |
| 2005/0178746 A1 | 8/2005 | Gorin |
| 2005/0181588 A1 | 8/2005 | Kim |
| 2005/0183666 A1 | 8/2005 | Tsuji et al. |
| 2005/0194094 A1 | 9/2005 | Yasaka |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0208217 A1 | 9/2005 | Shinriki et al. |
| 2005/0214477 A1 | 9/2005 | Hanawa et al. |
| 2005/0217582 A1 | 10/2005 | Kim et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0224181 A1 | 10/2005 | Merry et al. |
| 2005/0229848 A1 | 10/2005 | Shinriki et al. |
| 2005/0230350 A1 | 10/2005 | Kao et al. |
| 2005/0236694 A1 | 10/2005 | Wu et al. |
| 2005/0238807 A1 | 10/2005 | Lin et al. |
| 2005/0239282 A1 | 10/2005 | Chen et al. |

(56) References Cited

U.S. PATENT DOCUMENTS

| | | |
|---|---|---|
| 2005/0241579 A1 | 11/2005 | Kidd |
| 2005/0241583 A1 | 11/2005 | Buechel et al. |
| 2005/0241763 A1 | 11/2005 | Huang et al. |
| 2005/0251990 A1 | 11/2005 | Choi et al. |
| 2005/0257890 A1 | 11/2005 | Park et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |
| 2005/0279454 A1 | 12/2005 | Snijders |
| 2005/0283321 A1 | 12/2005 | Yue et al. |
| 2005/0287688 A1 | 12/2005 | Won et al. |
| 2005/0287755 A1 | 12/2005 | Bachmann |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0008676 A1 | 1/2006 | Ebata et al. |
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019477 A1 | 1/2006 | Hanawa et al. |
| 2006/0019486 A1 | 1/2006 | Yu et al. |
| 2006/0021574 A1 | 2/2006 | Armour et al. |
| 2006/0021701 A1 | 2/2006 | Tobe et al. |
| 2006/0021703 A1 | 2/2006 | Umotoy et al. |
| 2006/0024954 A1 | 2/2006 | Wu et al. |
| 2006/0024956 A1 | 2/2006 | Zhijian et al. |
| 2006/0032833 A1 | 2/2006 | Kawaguchi et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0054280 A1 | 3/2006 | Jang |
| 2006/0057828 A1 | 3/2006 | Omura et al. |
| 2006/0060942 A1 | 3/2006 | Minixhofer et al. |
| 2006/0065629 A1 | 3/2006 | Chen et al. |
| 2006/0073349 A1 | 4/2006 | Aihara et al. |
| 2006/0076108 A1 | 4/2006 | Holland et al. |
| 2006/0087644 A1 | 4/2006 | McMillin et al. |
| 2006/0090700 A1 | 5/2006 | Satoh et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0113038 A1 | 6/2006 | Gondhalekar et al. |
| 2006/0118178 A1 | 6/2006 | Desbiolles et al. |
| 2006/0118240 A1 | 6/2006 | Holber et al. |
| 2006/0121724 A1 | 6/2006 | Yue et al. |
| 2006/0124151 A1 | 6/2006 | Yamasaki et al. |
| 2006/0124242 A1 | 6/2006 | Kanarik et al. |
| 2006/0130971 A1 | 6/2006 | Chang et al. |
| 2006/0151115 A1 | 7/2006 | Kim et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0169410 A1 | 8/2006 | Maeda et al. |
| 2006/0178008 A1 | 8/2006 | Yeh et al. |
| 2006/0183270 A1 | 8/2006 | Humpston |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0207971 A1 | 9/2006 | Moriya et al. |
| 2006/0210713 A1 | 9/2006 | Brcka |
| 2006/0210723 A1 | 9/2006 | Ishizaka |
| 2006/0215347 A1 | 9/2006 | Wakabayashi |
| 2006/0216878 A1 | 9/2006 | Lee |
| 2006/0219360 A1 | 10/2006 | Iwasaki |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0245852 A1 | 11/2006 | Iwabuchi |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0285270 A1 | 12/2006 | Lee |
| 2006/0286774 A1 | 12/2006 | Singh et al. |
| 2006/0289384 A1 | 12/2006 | Pavel et al. |
| 2006/0292846 A1 | 12/2006 | Pinto et al. |
| 2007/0022952 A1 | 2/2007 | Ritchie et al. |
| 2007/0022954 A1 | 2/2007 | Iizuka et al. |
| 2007/0025907 A1 | 2/2007 | Rezeq |
| 2007/0039548 A1 | 2/2007 | Johnson |
| 2007/0048977 A1 | 3/2007 | Lee et al. |
| 2007/0051471 A1 | 3/2007 | Kawaguchi et al. |
| 2007/0056925 A1 | 3/2007 | Liu et al. |
| 2007/0062453 A1 | 3/2007 | Ishikawa |
| 2007/0066084 A1 | 3/2007 | Wajda et al. |
| 2007/0071888 A1 | 3/2007 | Shanmugasundram et al. |
| 2007/0072408 A1 | 3/2007 | Enomoto et al. |
| 2007/0077737 A1 | 4/2007 | Kobayashi et al. |
| 2007/0079758 A1 | 4/2007 | Holland et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0128864 A1 | 6/2007 | Ma |
| 2007/0128876 A1 | 6/2007 | Fukiage |
| 2007/0131274 A1 | 6/2007 | Stollwerck et al. |
| 2007/0145023 A1 | 6/2007 | Holber et al. |
| 2007/0148349 A1 | 6/2007 | Fukada |
| 2007/0154838 A1 | 7/2007 | Lee |
| 2007/0163440 A1 | 7/2007 | Kim et al. |
| 2007/0169703 A1 | 7/2007 | Elliot et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0212288 A1 | 9/2007 | Holst |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0232071 A1 | 10/2007 | Balseanu et al. |
| 2007/0235134 A1 | 10/2007 | Limuro |
| 2007/0235136 A1 | 10/2007 | Enomoto et al. |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0254169 A1 | 11/2007 | Kamins et al. |
| 2007/0258186 A1 | 11/2007 | Matyushkin et al. |
| 2007/0259467 A1 | 11/2007 | Tweet et al. |
| 2007/0264820 A1 | 11/2007 | Liu |
| 2007/0266946 A1 | 11/2007 | Choi |

(56) References Cited

U.S. PATENT DOCUMENTS

| | | |
|---|---|---|
| 2007/0272154 A1 | 11/2007 | Amikura et al. |
| 2007/0277734 A1 | 12/2007 | Lubomirsky et al. |
| 2007/0280816 A1 | 12/2007 | Kurita et al. |
| 2007/0281106 A1 | 12/2007 | Lubomirsky et al. |
| 2007/0284044 A1 | 12/2007 | Matsumoto et al. |
| 2007/0284344 A1 | 12/2007 | Todorov et al. |
| 2007/0287292 A1 | 12/2007 | Li et al. |
| 2007/0296967 A1 | 12/2007 | Gupta et al. |
| 2008/0003836 A1 | 1/2008 | Nishimura et al. |
| 2008/0011424 A1 | 1/2008 | Yin et al. |
| 2008/0017104 A1 | 1/2008 | Matyushkin et al. |
| 2008/0020570 A1 | 1/2008 | Naik |
| 2008/0029032 A1 | 2/2008 | Sun et al. |
| 2008/0035608 A1 | 2/2008 | Thomas et al. |
| 2008/0044593 A1 | 2/2008 | Seo et al. |
| 2008/0044990 A1 | 2/2008 | Lee |
| 2008/0050538 A1 | 2/2008 | Hirata |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0089001 A1 | 4/2008 | Parkhe et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0100222 A1 | 5/2008 | Lewington et al. |
| 2008/0102570 A1 | 5/2008 | Fischer et al. |
| 2008/0102640 A1 | 5/2008 | Hassan et al. |
| 2008/0102646 A1 | 5/2008 | Kawaguchi et al. |
| 2008/0104782 A1 | 5/2008 | Hughes |
| 2008/0105555 A1 | 5/2008 | Iwazaki et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0141941 A1 | 6/2008 | Augustino et al. |
| 2008/0142831 A1 | 6/2008 | Su |
| 2008/0153306 A1 | 6/2008 | Cho et al. |
| 2008/0156631 A1 | 7/2008 | Fair et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0169588 A1 | 7/2008 | Shih et al. |
| 2008/0171407 A1 | 7/2008 | Nakabayashi et al. |
| 2008/0173906 A1 | 7/2008 | Zhu |
| 2008/0176412 A1 | 7/2008 | Komeda |
| 2008/0178797 A1 | 7/2008 | Fodor et al. |
| 2008/0178805 A1 | 7/2008 | Paterson et al. |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0193673 A1 | 8/2008 | Paterson et al. |
| 2008/0196666 A1 | 8/2008 | Toshima |
| 2008/0202688 A1 | 8/2008 | Wu et al. |
| 2008/0202892 A1 | 8/2008 | Smith et al. |
| 2008/0213496 A1 | 9/2008 | Sun et al. |
| 2008/0216901 A1 | 9/2008 | Chamberlain et al. |
| 2008/0216958 A1 | 9/2008 | Goto et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0264337 A1 | 10/2008 | Sano et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2008/0317965 A1 | 12/2008 | Son et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1 | 1/2009 | Yang |
| 2009/0014127 A1 | 1/2009 | Shah et al. |
| 2009/0014323 A1 | 1/2009 | Yendler et al. |
| 2009/0014324 A1 | 1/2009 | Kawaguchi et al. |
| 2009/0017227 A1 | 1/2009 | Fu et al. |
| 2009/0022633 A1 | 1/2009 | Tomosue et al. |
| 2009/0036292 A1 | 2/2009 | Sun et al. |
| 2009/0045167 A1 | 2/2009 | Maruyama |
| 2009/0061640 A1 | 3/2009 | Wong et al. |
| 2009/0072401 A1 | 3/2009 | Arnold et al. |
| 2009/0075409 A1 | 3/2009 | Ueno et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095221 A1 | 4/2009 | Tam et al. |
| 2009/0095222 A1 | 4/2009 | Tam et al. |
| 2009/0095621 A1 | 4/2009 | Kao et al. |
| 2009/0098276 A1 | 4/2009 | Burrows |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0117270 A1 | 5/2009 | Yamasaki et al. |
| 2009/0120364 A1 | 5/2009 | Suarez et al. |
| 2009/0120464 A1 | 5/2009 | Rasheed et al. |
| 2009/0120582 A1 | 5/2009 | Koshimizu |
| 2009/0140738 A1 | 6/2009 | Desvaux et al. |
| 2009/0159213 A1 | 6/2009 | Bera et al. |
| 2009/0159566 A1 | 6/2009 | Brillhart et al. |
| 2009/0159588 A1 | 6/2009 | Morioka et al. |
| 2009/0162647 A1 | 6/2009 | Sun et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0189287 A1 | 7/2009 | Yang et al. |
| 2009/0191711 A1 | 7/2009 | Rui et al. |
| 2009/0194233 A1 | 8/2009 | Tamura |
| 2009/0194810 A1 | 8/2009 | Kiyotoshi et al. |
| 2009/0197418 A1 | 8/2009 | Sago et al. |
| 2009/0202721 A1 | 8/2009 | Nogami et al. |
| 2009/0212804 A1 | 8/2009 | Yamada et al. |
| 2009/0214825 A1 | 8/2009 | Sun et al. |
| 2009/0223928 A1 | 9/2009 | Colpo et al. |
| 2009/0226633 A1 | 9/2009 | Laflamme et al. |
| 2009/0236314 A1 | 9/2009 | Chen |
| 2009/0253222 A1 | 10/2009 | Morisawa et al. |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0286405 A1 | 11/2009 | Okesaku et al. |
| 2009/0293809 A1 | 12/2009 | Cho et al. |
| 2009/0294898 A1 | 12/2009 | Feustel et al. |
| 2009/0298256 A1 | 12/2009 | Chen et al. |
| 2009/0302005 A1 | 12/2009 | Kool et al. |
| 2009/0314309 A1 | 12/2009 | Sankarakrishnan et al. |
| 2009/0314433 A1 | 12/2009 | Hoffman et al. |
| 2009/0317978 A1 | 12/2009 | Higashi |
| 2009/0320756 A1 | 12/2009 | Tanaka |
| 2010/0000683 A1 | 1/2010 | Kadkhodayan et al. |
| 2010/0003406 A1 | 1/2010 | Lam et al. |
| 2010/0003824 A1 | 1/2010 | Kadkhodayan et al. |
| 2010/0006032 A1 | 1/2010 | Hinckley et al. |
| 2010/0006543 A1 | 1/2010 | Sawada et al. |
| 2010/0018648 A1 | 1/2010 | Collins et al. |
| 2010/0022030 A1 | 1/2010 | Ditizio |
| 2010/0025370 A1 | 2/2010 | Dieguez-Campo et al. |
| 2010/0037821 A1 | 2/2010 | Nogami |
| 2010/0039747 A1 | 2/2010 | Sansoni |
| 2010/0047080 A1 | 2/2010 | Bruce |
| 2010/0048022 A1 | 2/2010 | Kubota |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |

(56) References Cited

U.S. PATENT DOCUMENTS

| | | |
|---|---|---|
| 2010/0062603 A1 | 3/2010 | Ganguly et al. |
| 2010/0072172 A1 | 3/2010 | Ui et al. |
| 2010/0075503 A1 | 3/2010 | Bencher |
| 2010/0081285 A1 | 4/2010 | Chen et al. |
| 2010/0089533 A1 | 4/2010 | Ueda et al. |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0098882 A1 | 4/2010 | Lubomirsky et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0116788 A1 | 5/2010 | Singh et al. |
| 2010/0119843 A1 | 5/2010 | Sun et al. |
| 2010/0129974 A1 | 5/2010 | Futase et al. |
| 2010/0130001 A1 | 5/2010 | Noguchi |
| 2010/0139889 A1 | 6/2010 | Kurita et al. |
| 2010/0144140 A1 | 6/2010 | Chandrashekar et al. |
| 2010/0147219 A1 | 6/2010 | Hsieh et al. |
| 2010/0151149 A1 | 6/2010 | Ovshinsky |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura et al. |
| 2010/0203739 A1 | 8/2010 | Becker et al. |
| 2010/0206483 A1 | 8/2010 | Sorensen et al. |
| 2010/0207195 A1 | 8/2010 | Fukuzumi et al. |
| 2010/0207205 A1 | 8/2010 | Grebs et al. |
| 2010/0212594 A1 | 8/2010 | Hara et al. |
| 2010/0213172 A1 | 8/2010 | Wilson |
| 2010/0224322 A1 | 9/2010 | Sui et al. |
| 2010/0224324 A1 | 9/2010 | Kasai |
| 2010/0240205 A1 | 9/2010 | Son |
| 2010/0243165 A1 | 9/2010 | Um |
| 2010/0243606 A1 | 9/2010 | Koshimizu et al. |
| 2010/0244204 A1 | 9/2010 | Matsuoka et al. |
| 2010/0248488 A1 | 9/2010 | Agarwal et al. |
| 2010/0252068 A1 | 10/2010 | Kannan et al. |
| 2010/0258913 A1 | 10/2010 | Lue |
| 2010/0267224 A1 | 10/2010 | Choi et al. |
| 2010/0267248 A1 | 10/2010 | Ma et al. |
| 2010/0273290 A1 | 10/2010 | Kryliouk |
| 2010/0273291 A1 | 10/2010 | Kryliouk et al. |
| 2010/0288369 A1 | 11/2010 | Chang et al. |
| 2010/0294199 A1 | 11/2010 | Tran et al. |
| 2010/0310785 A1 | 12/2010 | Sasakawa et al. |
| 2010/0314005 A1 | 12/2010 | Saito et al. |
| 2010/0317197 A1 | 12/2010 | Lind et al. |
| 2010/0330814 A1 | 12/2010 | Yokota et al. |
| 2011/0005607 A1 | 1/2011 | Desbiolles et al. |
| 2011/0005684 A1 | 1/2011 | Hayami et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka et al. |
| 2011/0043228 A1 | 2/2011 | Makhratchev et al. |
| 2011/0045676 A1 | 2/2011 | Park |
| 2011/0048325 A1 | 3/2011 | Choie et al. |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0076401 A1 | 3/2011 | Chao et al. |
| 2011/0081782 A1 | 4/2011 | Liang et al. |
| 2011/0088847 A1 | 4/2011 | Law et al. |
| 2011/0100489 A1 | 5/2011 | Orito |
| 2011/0101335 A1 | 5/2011 | Yamazaki et al. |
| 2011/0104393 A1 | 5/2011 | Hilkene et al. |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0133650 A1 | 6/2011 | Kim |
| 2011/0139748 A1 | 6/2011 | Donnelly et al. |
| 2011/0140229 A1 | 6/2011 | Rachmady et al. |
| 2011/0143542 A1 | 6/2011 | Feurprier et al. |
| 2011/0146909 A1 | 6/2011 | Shi et al. |
| 2011/0147363 A1 | 6/2011 | Yap et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165347 A1 | 7/2011 | Miller et al. |
| 2011/0165771 A1 | 7/2011 | Ring et al. |
| 2011/0174778 A1 | 7/2011 | Sawada et al. |
| 2011/0180847 A1 | 7/2011 | Ikeda et al. |
| 2011/0195575 A1 | 8/2011 | Wang |
| 2011/0198034 A1 | 8/2011 | Sun et al. |
| 2011/0204025 A1 | 8/2011 | Tahara |
| 2011/0207332 A1 | 8/2011 | Liu et al. |
| 2011/0217851 A1 | 9/2011 | Liang et al. |
| 2011/0223334 A1 | 9/2011 | Yudovsky et al. |
| 2011/0226734 A1 | 9/2011 | Sumiya et al. |
| 2011/0227028 A1 | 9/2011 | Sekar et al. |
| 2011/0230008 A1 | 9/2011 | Lakshmanan et al. |
| 2011/0230052 A1 | 9/2011 | Tang et al. |
| 2011/0232737 A1 | 9/2011 | Ruletzki et al. |
| 2011/0232845 A1 | 9/2011 | Riker et al. |
| 2011/0244686 A1 | 10/2011 | Aso et al. |
| 2011/0244693 A1 | 10/2011 | Tamura et al. |
| 2011/0256421 A1 | 10/2011 | Bose et al. |
| 2011/0265884 A1 | 11/2011 | Xu et al. |
| 2011/0265887 A1 | 11/2011 | Lee et al. |
| 2011/0265951 A1 | 11/2011 | Xu |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1 | 11/2011 | Lai et al. |
| 2011/0287633 A1 | 11/2011 | Lee et al. |
| 2011/0294300 A1 | 12/2011 | Zhang et al. |
| 2011/0298061 A1 | 12/2011 | Siddiqui et al. |
| 2011/0303146 A1 | 12/2011 | Nishijima |
| 2011/0304078 A1 | 12/2011 | Lee et al. |
| 2011/0308453 A1 | 12/2011 | Su et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0037596 A1 | 2/2012 | Eto et al. |
| 2012/0040492 A1 | 2/2012 | Ovshinsky et al. |
| 2012/0052683 A1 | 3/2012 | Kim et al. |
| 2012/0055402 A1 | 3/2012 | Moriya et al. |
| 2012/0068242 A1 | 3/2012 | Shin et al. |
| 2012/0070982 A1 | 3/2012 | Yu et al. |
| 2012/0070996 A1 | 3/2012 | Hao et al. |
| 2012/0073501 A1 | 3/2012 | Lubomirsky et al. |
| 2012/0091108 A1 | 4/2012 | Lin et al. |
| 2012/0097330 A1 | 4/2012 | Iyengar et al. |
| 2012/0100720 A1 | 4/2012 | Winniczek et al. |
| 2012/0103518 A1 | 5/2012 | Kakimoto |
| 2012/0104564 A1 | 5/2012 | Won et al. |
| 2012/0119225 A1 | 5/2012 | Shiomi et al. |
| 2012/0122302 A1 | 5/2012 | Weidman et al. |
| 2012/0122319 A1 | 5/2012 | Shimizu |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |

(56) References Cited

U.S. PATENT DOCUMENTS

| | | |
|---|---|---|
| 2012/0171852 A1 | 7/2012 | Yuan et al. |
| 2012/0180954 A1 | 7/2012 | Yang et al. |
| 2012/0181599 A1 | 7/2012 | Lung |
| 2012/0182808 A1 | 7/2012 | Lue et al. |
| 2012/0187844 A1 | 7/2012 | Hoffman et al. |
| 2012/0196447 A1 | 8/2012 | Yang et al. |
| 2012/0196451 A1 | 8/2012 | Mallick |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0211722 A1 | 8/2012 | Kellam et al. |
| 2012/0222616 A1 | 9/2012 | Han et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0234945 A1 | 9/2012 | Olgado |
| 2012/0238102 A1 | 9/2012 | Zhang et al. |
| 2012/0238103 A1 | 9/2012 | Zhang et al. |
| 2012/0238108 A1 | 9/2012 | Chen et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0247677 A1 | 10/2012 | Himori et al. |
| 2012/0255491 A1 | 10/2012 | Hadidi |
| 2012/0258600 A1 | 10/2012 | Godet et al. |
| 2012/0258607 A1 | 10/2012 | Holland et al. |
| 2012/0267346 A1 | 10/2012 | Kao et al. |
| 2012/0269968 A1 | 10/2012 | Rayner |
| 2012/0282779 A1 | 11/2012 | Arnold et al. |
| 2012/0285619 A1 | 11/2012 | Matyushkin et al. |
| 2012/0285621 A1 | 11/2012 | Tan |
| 2012/0291696 A1 | 11/2012 | Clarke |
| 2012/0292664 A1 | 11/2012 | Kanike |
| 2012/0304933 A1 | 12/2012 | Mai et al. |
| 2012/0309204 A1 | 12/2012 | Kang et al. |
| 2012/0309205 A1 | 12/2012 | Wang et al. |
| 2012/0322015 A1 | 12/2012 | Kim |
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012030 A1 | 1/2013 | Lakshmanan et al. |
| 2013/0012032 A1 | 1/2013 | Liu et al. |
| 2013/0023062 A1 | 1/2013 | Masuda et al. |
| 2013/0023094 A1 | 1/2013 | Yeh et al. |
| 2013/0023124 A1 | 1/2013 | Nemani et al. |
| 2013/0023125 A1 | 1/2013 | Singh |
| 2013/0026135 A1 | 1/2013 | Kim |
| 2013/0032574 A1 | 2/2013 | Liu et al. |
| 2013/0034666 A1 | 2/2013 | Liang et al. |
| 2013/0034968 A1 | 2/2013 | Zhang et al. |
| 2013/0037919 A1 | 2/2013 | Sapra et al. |
| 2013/0045605 A1 | 2/2013 | Wang et al. |
| 2013/0049592 A1 | 2/2013 | Yeom et al. |
| 2013/0052804 A1 | 2/2013 | Song |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0059448 A1 | 3/2013 | Marakhtanov et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0087309 A1 | 4/2013 | Volfovski |
| 2013/0089988 A1 | 4/2013 | Wang et al. |
| 2013/0095646 A1 | 4/2013 | Alsmeier et al. |
| 2013/0098868 A1 | 4/2013 | Nishimura et al. |
| 2013/0105303 A1 | 5/2013 | Lubomirsky et al. |
| 2013/0105948 A1 | 5/2013 | Kewley |
| 2013/0107415 A1 | 5/2013 | Banna et al. |
| 2013/0112383 A1 | 5/2013 | Hanamachi |
| 2013/0115372 A1 | 5/2013 | Pavol et al. |
| 2013/0118686 A1 | 5/2013 | Carducci et al. |
| 2013/0119016 A1 | 5/2013 | Kagoshima et al. |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0133578 A1 | 5/2013 | Hwang |
| 2013/0149866 A1 | 6/2013 | Shriner |
| 2013/0150303 A1 | 6/2013 | Kungl et al. |
| 2013/0152859 A1* | 6/2013 | Collins .................. C30B 25/12 118/729 |
| 2013/0155568 A1 | 6/2013 | Todorow et al. |
| 2013/0161726 A1 | 6/2013 | Kim et al. |
| 2013/0171810 A1 | 7/2013 | Sun et al. |
| 2013/0171827 A1 | 7/2013 | Cho et al. |
| 2013/0175654 A1 | 7/2013 | Muckenhirn et al. |
| 2013/0187220 A1 | 7/2013 | Surthi |
| 2013/0193108 A1 | 8/2013 | Zheng |
| 2013/0213935 A1 | 8/2013 | Liao et al. |
| 2013/0217243 A1 | 8/2013 | Underwood et al. |
| 2013/0224953 A1 | 8/2013 | Salinas et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0276983 A1 | 10/2013 | Park et al. |
| 2013/0279066 A1 | 10/2013 | Lubomirsky et al. |
| 2013/0284369 A1 | 10/2013 | Kobayashi et al. |
| 2013/0284370 A1 | 10/2013 | Kobayashi et al. |
| 2013/0284373 A1 | 10/2013 | Sun et al. |
| 2013/0284374 A1 | 10/2013 | Lubomirsky et al. |
| 2013/0284700 A1 | 10/2013 | Nangoy et al. |
| 2013/0286530 A1 | 10/2013 | Lin et al. |
| 2013/0295297 A1 | 11/2013 | Chou et al. |
| 2013/0298942 A1 | 11/2013 | Ren et al. |
| 2013/0302980 A1 | 11/2013 | Chandrashekar et al. |
| 2013/0320550 A1 | 12/2013 | Kim |
| 2013/0337655 A1 | 12/2013 | Lee et al. |
| 2013/0343829 A1 | 12/2013 | Benedetti et al. |
| 2014/0004707 A1 | 1/2014 | Thedjoisworo et al. |
| 2014/0004708 A1 | 1/2014 | Thedjoisworo et al. |
| 2014/0008880 A1 | 1/2014 | Miura et al. |
| 2014/0020708 A1 | 1/2014 | Kim et al. |
| 2014/0021673 A1 | 1/2014 | Chen et al. |
| 2014/0026813 A1 | 1/2014 | Wang et al. |
| 2014/0053866 A1 | 2/2014 | Baluja et al. |
| 2014/0054269 A1 | 2/2014 | Hudson et al. |
| 2014/0057447 A1 | 2/2014 | Yang et al. |
| 2014/0062285 A1 | 3/2014 | Chen |
| 2014/0065827 A1 | 3/2014 | Kang et al. |
| 2014/0065842 A1 | 3/2014 | Anthis et al. |
| 2014/0076234 A1 | 3/2014 | Kao et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0102367 A1 | 4/2014 | Ishibashi |
| 2014/0110061 A1 | 4/2014 | Okunishi |
| 2014/0124364 A1 | 5/2014 | Yoo et al. |
| 2014/0134842 A1 | 5/2014 | Zhange et al. |
| 2014/0134847 A1 | 5/2014 | Seya |
| 2014/0141621 A1 | 5/2014 | Ren et al. |
| 2014/0147126 A1 | 5/2014 | Yamashita et al. |
| 2014/0152312 A1 | 6/2014 | Snow et al. |
| 2014/0154668 A1 | 6/2014 | Chou et al. |
| 2014/0154889 A1 | 6/2014 | Wang et al. |
| 2014/0165912 A1 | 6/2014 | Kao et al. |
| 2014/0166617 A1 | 6/2014 | Chen |
| 2014/0166618 A1 | 6/2014 | Tadigadapa et al. |
| 2014/0175530 A1 | 6/2014 | Chien et al. |
| 2014/0175534 A1 | 6/2014 | Kofuji et al. |
| 2014/0186772 A1 | 7/2014 | Pohlers et al. |
| 2014/0190410 A1 | 7/2014 | Kim |
| 2014/0190632 A1 | 7/2014 | Kumar et al. |
| 2014/0191388 A1 | 7/2014 | Chen |
| 2014/0199850 A1 | 7/2014 | Kim et al. |
| 2014/0199851 A1 | 7/2014 | Nemani et al. |
| 2014/0209245 A1 | 7/2014 | Yamamoto et al. |
| 2014/0216337 A1 | 8/2014 | Swaminathan et al. |

(56) References Cited

U.S. PATENT DOCUMENTS

| | | |
|---|---|---|
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0251956 A1 | 9/2014 | Jeon et al. |
| 2014/0253900 A1 | 9/2014 | Cornelissen et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263172 A1 | 9/2014 | Xie et al. |
| 2014/0263272 A1 | 9/2014 | Duan et al. |
| 2014/0264507 A1 | 9/2014 | Lee et al. |
| 2014/0264533 A1 | 9/2014 | Simsek-Ege |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273487 A1 | 9/2014 | Deshmukh et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao et al. |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2014/0357083 A1 | 12/2014 | Ling et al. |
| 2014/0361684 A1 | 12/2014 | Ikeda et al. |
| 2014/0363977 A1 | 12/2014 | Morimoto et al. |
| 2014/0363979 A1 | 12/2014 | Or et al. |
| 2014/0373782 A1 | 12/2014 | Park et al. |
| 2015/0007770 A1 | 1/2015 | Chandrasekharan et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0041430 A1 | 2/2015 | Yoshino et al. |
| 2015/0050812 A1 | 2/2015 | Smith |
| 2015/0056814 A1 | 2/2015 | Ling et al. |
| 2015/0060265 A1 | 3/2015 | Cho et al. |
| 2015/0064918 A1 | 3/2015 | Ranjan et al. |
| 2015/0072508 A1 | 3/2015 | Or et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0093891 A1 | 4/2015 | Zope |
| 2015/0118822 A1 | 4/2015 | Zhang et al. |
| 2015/0118858 A1 | 4/2015 | Takaba |
| 2015/0123541 A1 | 5/2015 | Baek et al. |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0140827 A1 | 5/2015 | Kao et al. |
| 2015/0152072 A1 | 6/2015 | Cantat et al. |
| 2015/0155177 A1 | 6/2015 | Zhang et al. |
| 2015/0167705 A1 | 6/2015 | Lee et al. |
| 2015/0170811 A1 | 6/2015 | Tanigawa et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0187625 A1 | 7/2015 | Busche et al. |
| 2015/0191823 A1 | 7/2015 | Banna et al. |
| 2015/0194435 A1 | 7/2015 | Lee |
| 2015/0200042 A1 | 7/2015 | Ling et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214101 A1 | 7/2015 | Ren et al. |
| 2015/0214337 A1 | 7/2015 | Ko et al. |
| 2015/0221479 A1 | 8/2015 | Chen et al. |
| 2015/0221541 A1 | 8/2015 | Nemani et al. |
| 2015/0228456 A1 | 8/2015 | Ye et al. |
| 2015/0235809 A1 | 8/2015 | Ito et al. |
| 2015/0235860 A1 | 8/2015 | Tomura et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0240359 A1 | 8/2015 | Jdira et al. |
| 2015/0247231 A1 | 9/2015 | Nguyen et al. |
| 2015/0249018 A1 | 9/2015 | Park et al. |
| 2015/0255481 A1 | 9/2015 | Baenninger et al. |
| 2015/0270105 A1 | 9/2015 | Kobayashi et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0279687 A1 | 10/2015 | Xue et al. |
| 2015/0294980 A1 | 10/2015 | Lee et al. |
| 2015/0303031 A1 | 10/2015 | Choi |
| 2015/0332930 A1 | 11/2015 | Wang et al. |
| 2015/0332953 A1 | 11/2015 | Futase et al. |
| 2015/0340225 A1 | 11/2015 | Kim et al. |
| 2015/0340371 A1 | 11/2015 | Lue |
| 2015/0345029 A1 | 12/2015 | Wang et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2015/0371877 A1 | 12/2015 | Lin et al. |
| 2015/0376782 A1 | 12/2015 | Griffin et al. |
| 2015/0380419 A1 | 12/2015 | Gunji-Yoneoka et al. |
| 2015/0380431 A1 | 12/2015 | Kanamori et al. |
| 2016/0005572 A1 | 1/2016 | Liang et al. |
| 2016/0005833 A1 | 1/2016 | Collins et al. |
| 2016/0020071 A1 | 1/2016 | Khaja et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042920 A1 | 2/2016 | Cho et al. |
| 2016/0042968 A1 | 2/2016 | Purayath et al. |
| 2016/0043099 A1 | 2/2016 | Purayath et al. |
| 2016/0056167 A1 | 2/2016 | Wang et al. |
| 2016/0056235 A1 | 2/2016 | Lee et al. |
| 2016/0064212 A1 | 3/2016 | Thedjoisworo et al. |
| 2016/0064233 A1 | 3/2016 | Wang et al. |
| 2016/0079062 A1 | 3/2016 | Zheng et al. |
| 2016/0079072 A1 | 3/2016 | Wang et al. |
| 2016/0083844 A1 | 3/2016 | Nishitani et al. |
| 2016/0086772 A1 | 3/2016 | Khaja |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1 | 3/2016 | Chen et al. |
| 2016/0093737 A1 | 3/2016 | Li et al. |
| 2016/0099173 A1 | 4/2016 | Agarwal et al. |
| 2016/0104606 A1 | 4/2016 | Park et al. |
| 2016/0104648 A1 | 4/2016 | Park et al. |
| 2016/0109863 A1 | 4/2016 | Valcore et al. |
| 2016/0117425 A1 | 4/2016 | Povolny et al. |
| 2016/0118227 A1 | 4/2016 | Valcore et al. |
| 2016/0118268 A1 | 4/2016 | Ingle et al. |

(56) References Cited

U.S. PATENT DOCUMENTS

| | | |
|---|---|---|
| 2016/0118396 A1 | 4/2016 | Rabkin et al. |
| 2016/0126118 A1 | 5/2016 | Chen et al. |
| 2016/0133480 A1 | 5/2016 | Ko et al. |
| 2016/0136660 A1 | 5/2016 | Song |
| 2016/0141419 A1 | 5/2016 | Baenninger et al. |
| 2016/0148805 A1 | 5/2016 | Jongbloed et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |
| 2016/0172216 A1 | 6/2016 | Marakhtanov et al. |
| 2016/0181112 A1 | 6/2016 | Xue et al. |
| 2016/0181116 A1 | 6/2016 | Berry et al. |
| 2016/0189933 A1 | 6/2016 | Kobayashi et al. |
| 2016/0190147 A1 | 6/2016 | Kato et al. |
| 2016/0196969 A1 | 7/2016 | Berry et al. |
| 2016/0196984 A1 | 7/2016 | Lill et al. |
| 2016/0196985 A1 | 7/2016 | Tan et al. |
| 2016/0203958 A1 | 7/2016 | Arase et al. |
| 2016/0204009 A1 | 7/2016 | Nguyen et al. |
| 2016/0208395 A1 | 7/2016 | Ooshima |
| 2016/0218018 A1 | 7/2016 | Liu et al. |
| 2016/0222522 A1 | 8/2016 | Wang et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240353 A1 | 8/2016 | Nagami |
| 2016/0240389 A1 | 8/2016 | Zhang et al. |
| 2016/0240402 A1 | 8/2016 | Park et al. |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |
| 2016/0293398 A1 | 10/2016 | Danek et al. |
| 2016/0293438 A1 | 10/2016 | Zhou et al. |
| 2016/0300694 A1 | 10/2016 | Yang et al. |
| 2016/0307772 A1 | 10/2016 | Choi et al. |
| 2016/0307773 A1 | 10/2016 | Lee et al. |
| 2016/0314961 A1 | 10/2016 | Liu et al. |
| 2016/0314985 A1 | 10/2016 | Yang et al. |
| 2016/0319452 A1 | 11/2016 | Eidschun et al. |
| 2016/0340781 A1 | 11/2016 | Thomas et al. |
| 2016/0343548 A1 | 11/2016 | Howald et al. |
| 2016/0358793 A1 | 12/2016 | Okumura et al. |
| 2017/0011922 A1 | 1/2017 | Tanimura et al. |
| 2017/0040175 A1 | 2/2017 | Xu et al. |
| 2017/0040180 A1 | 2/2017 | Xu et al. |
| 2017/0040190 A1 | 2/2017 | Benjaminson et al. |
| 2017/0040191 A1 | 2/2017 | Benjaminson et al. |
| 2017/0040207 A1 | 2/2017 | Purayath et al. |
| 2017/0040214 A1 | 2/2017 | Lai et al. |
| 2017/0053808 A1 | 2/2017 | Kamp et al. |
| 2017/0062184 A1 | 3/2017 | Tran et al. |
| 2017/0110290 A1 | 4/2017 | Kobayashi et al. |
| 2017/0110335 A1 | 4/2017 | Yang et al. |
| 2017/0110475 A1 | 4/2017 | Liu et al. |
| 2017/0121818 A1 | 5/2017 | Dunn et al. |
| 2017/0133202 A1 | 5/2017 | Berry |
| 2017/0169995 A1 | 6/2017 | Kim et al. |
| 2017/0178894 A1 | 6/2017 | Stone et al. |
| 2017/0178899 A1 | 6/2017 | Kabansky et al. |
| 2017/0178924 A1 | 6/2017 | Chen et al. |
| 2017/0194128 A1 | 7/2017 | Lai et al. |
| 2017/0207088 A1 | 7/2017 | Kwon et al. |
| 2017/0226637 A1 | 8/2017 | Lubomirsky et al. |
| 2017/0229287 A1 | 8/2017 | Xu et al. |
| 2017/0229289 A1 | 8/2017 | Lubomirsky et al. |
| 2017/0229291 A1 | 8/2017 | Singh et al. |
| 2017/0229293 A1 | 8/2017 | Park et al. |
| 2017/0229326 A1 | 8/2017 | Tran et al. |
| 2017/0229328 A1 | 8/2017 | Benjaminson et al. |
| 2017/0229329 A1 | 8/2017 | Benjaminson et al. |
| 2017/0236691 A1 | 8/2017 | Liang et al. |
| 2017/0236694 A1 | 8/2017 | Eason et al. |
| 2017/0250193 A1 | 8/2017 | Huo |
| 2017/0294445 A1 | 10/2017 | Son et al. |
| 2017/0306494 A1 | 10/2017 | Lin et al. |
| 2017/0309509 A1 | 10/2017 | Tran et al. |
| 2017/0316935 A1 | 11/2017 | Tan et al. |
| 2017/0338133 A1 | 11/2017 | Tan et al. |
| 2017/0338134 A1 | 11/2017 | Tan et al. |
| 2017/0350011 A1 | 12/2017 | Marquardt |
| 2017/0373082 A1 | 12/2017 | Sekine et al. |
| 2018/0005850 A1 | 1/2018 | Citla et al. |
| 2018/0006050 A1 | 1/2018 | Watanabe et al. |
| 2018/0025900 A1 | 1/2018 | Park et al. |
| 2018/0069000 A1 | 3/2018 | Bergendahl et al. |
| 2018/0076031 A1 | 3/2018 | Yan et al. |
| 2018/0076044 A1 | 3/2018 | Choi et al. |
| 2018/0076083 A1 | 3/2018 | Ko et al. |
| 2018/0080124 A1 | 3/2018 | Bajaj et al. |
| 2018/0082861 A1 | 3/2018 | Citla et al. |
| 2018/0096818 A1 | 4/2018 | Lubomirsky |
| 2018/0096819 A1 | 4/2018 | Lubomirsky et al. |
| 2018/0096821 A1 | 4/2018 | Lubomirsky et al. |
| 2018/0096865 A1 | 4/2018 | Lubomirsky et al. |
| 2018/0102255 A1 | 4/2018 | Chen et al. |
| 2018/0102256 A1 | 4/2018 | Chen et al. |
| 2018/0102259 A1 | 4/2018 | Wang et al. |
| 2018/0130818 A1 | 5/2018 | Kim et al. |
| 2018/0138049 A1 | 5/2018 | Ko et al. |
| 2018/0138055 A1 | 5/2018 | Xu et al. |
| 2018/0138075 A1 | 5/2018 | Kang et al. |
| 2018/0138085 A1 | 5/2018 | Wang et al. |
| 2018/0175051 A1 | 6/2018 | Lue et al. |
| 2018/0182633 A1 | 6/2018 | Pandit et al. |
| 2018/0182777 A1 | 6/2018 | Cui et al. |
| 2018/0211862 A1* | 7/2018 | Konkola ........... C23C 16/45544 |
| 2018/0223437 A1 | 8/2018 | Geroge et al. |
| 2018/0226223 A1 | 8/2018 | Lubomirsky |
| 2018/0226230 A1 | 8/2018 | Kobayashi et al. |
| 2018/0226259 A1 | 8/2018 | Choi et al. |
| 2018/0226278 A1 | 8/2018 | Arnepalli et al. |
| 2018/0226425 A1 | 8/2018 | Purayath |
| 2018/0226426 A1 | 8/2018 | Purayath |
| 2018/0240654 A1 | 8/2018 | Park et al. |
| 2018/0261516 A1 | 9/2018 | Lin et al. |
| 2018/0261686 A1 | 9/2018 | Lin et al. |
| 2018/0366351 A1 | 12/2018 | Lubomirsky |

FOREIGN PATENT DOCUMENTS

| | | |
|---|---|---|
| CN | 101236893 A | 8/2008 |
| CN | 101378850 A | 3/2009 |
| CN | 102893705 | 1/2013 |
| EP | 1675160 A1 | 6/2006 |
| JP | S59-126778 A | 7/1984 |
| JP | S62-45119 A | 2/1987 |
| JP | 63301051 A | 12/1988 |
| JP | H01-200627 A | 8/1989 |
| JP | H02-114525 A | 4/1990 |
| JP | H07-153739 A | 6/1995 |
| JP | H8-31755 A | 2/1996 |
| JP | H08-107101 A | 4/1996 |
| JP | H08-031206 A | 10/1996 |
| JP | H09-260356 A | 10/1997 |
| JP | 2001-313282 A | 11/2001 |
| JP | 2001-332608 A | 11/2001 |
| JP | 2002-075972 A | 3/2002 |
| JP | 2002-083869 A | 3/2002 |
| JP | 2003-174020 A | 6/2003 |
| JP | 2003-282591 A | 10/2003 |
| JP | 2004-508709 A | 3/2004 |
| JP | 2004-296467 A | 10/2004 |
| JP | 2005-050908 A | 2/2005 |
| JP | 2006-041039 A | 2/2006 |
| JP | 2006-066408 A | 3/2006 |
| JP | 2008-288560 A | 11/2008 |
| JP | 4191137 B2 | 12/2008 |
| JP | 2009-141343 A | 6/2009 |
| JP | 2009-530871 A | 8/2009 |
| JP | 2009-239056 A | 10/2009 |
| JP | 2010-034132 A | 2/2010 |
| JP | 2010-180458 | 8/2010 |
| JP | 2011-508436 A | 3/2011 |

(56) References Cited

FOREIGN PATENT DOCUMENTS

| | | |
|---|---|---|
| JP | 2011-518408 A | 6/2011 |
| JP | 4763293 B2 | 8/2011 |
| JP | 2011-171378 A | 9/2011 |
| JP | 2012-19164 A | 1/2012 |
| JP | 2012-019194 A | 1/2012 |
| JP | 2012-512531 A | 5/2012 |
| JP | 2013-243418 A | 12/2013 |
| JP | 5802323 B2 | 10/2015 |
| JP | 2016-111177 A | 6/2016 |
| KR | 10-2000-0082778 A | 2/2000 |
| KR | 10-2000-0064946 A | 11/2000 |
| KR | 10-2001-0056735 A | 7/2001 |
| KR | 2003-0023964 A | 3/2003 |
| KR | 10-2003-0054726 A | 7/2003 |
| KR | 10-2003-0083663 A | 10/2003 |
| KR | 100441297 B1 | 7/2004 |
| KR | 10-2005-0007143 A | 1/2005 |
| KR | 10-2005-0042701 A | 5/2005 |
| KR | 2005-0049903 A | 5/2005 |
| KR | 10-2006-0080509 A | 7/2006 |
| KR | 1006-41762 B1 | 11/2006 |
| KR | 10-2006-0127173 A | 12/2006 |
| KR | 100663668 B1 | 1/2007 |
| KR | 100678696 B1 | 1/2007 |
| KR | 100712727 B1 | 4/2007 |
| KR | 2007-0079870 A | 8/2007 |
| KR | 10-2008-0063988 A | 7/2008 |
| KR | 10-0843236 B1 | 7/2008 |
| KR | 10-2009-0040869 A | 4/2009 |
| KR | 10-2009-0128913 A | 12/2009 |
| KR | 10-2013-0013980 A | 2/2010 |
| KR | 10-2010-0093358 A | 8/2010 |
| KR | 10-2011-0086540 A | 7/2011 |
| KR | 10-2011-0114538 A | 10/2011 |
| KR | 10-2011-0126675 A | 11/2011 |
| KR | 10-2012-0022251 A | 3/2012 |
| KR | 10-2012-0082640 A | 7/2012 |
| KR | 10-2016-0002543 A | 1/2016 |
| TW | 2006-12480 A | 4/2006 |
| TW | 200709256 A | 3/2007 |
| TW | 2007-35196 A | 9/2007 |
| TW | 2011-27983 A1 | 8/2011 |
| TW | 2012-07919 | 2/2012 |
| TW | 2012-13594 A | 4/2012 |
| TW | 2012-33842 A1 | 8/2012 |
| WO | 2008-112673 A2 | 9/2008 |
| WO | 2009-009611 A2 | 1/2009 |
| WO | 2009-084194 A1 | 7/2009 |
| WO | 2010-010706 | 1/2010 |
| WO | 2010-113946 A1 | 10/2010 |
| WO | 2011-027515 A | 3/2011 |
| WO | 2011-031556 A | 3/2011 |
| WO | 2011070945 A1 | 6/2011 |
| WO | 2011-095846 A1 | 8/2011 |
| WO | 2011-149638 A | 12/2011 |
| WO | 2012-050321 A | 4/2012 |
| WO | 2012-118987 A1 | 9/2012 |
| WO | 2012-125656 A2 | 9/2012 |
| WO | 2012-148568 A1 | 11/2012 |
| WO | 2013-118260 A1 | 8/2013 |

* cited by examiner

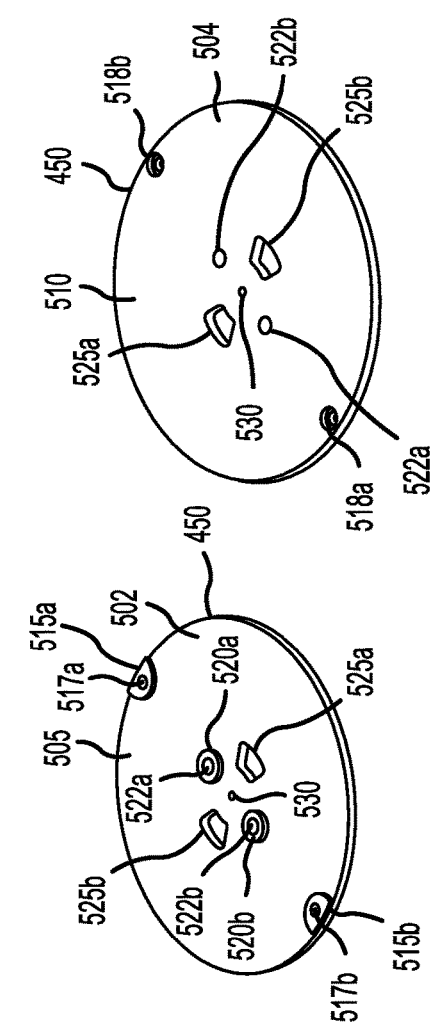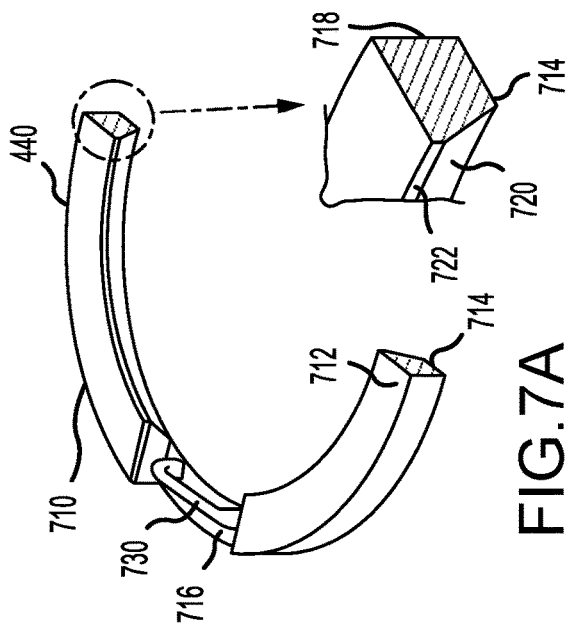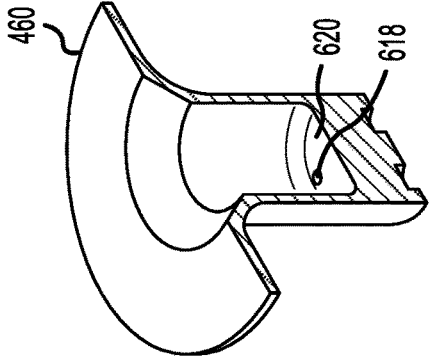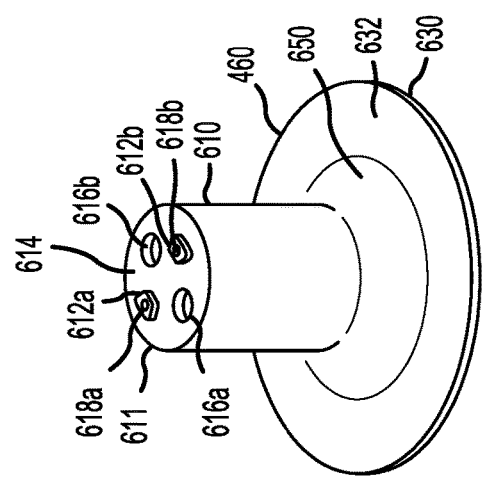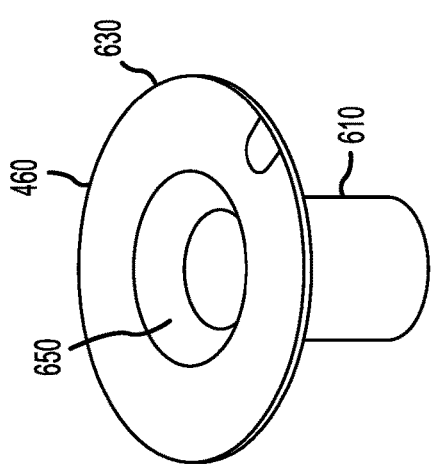

SYSTEMS AND METHODS FOR PEDESTAL CONFIGURATION

CROSS REFERENCES TO RELATED APPLICATIONS

This application claims priority to U.S. Provisional Application No. 62/702,675, filed Jul. 24, 2018. The entire contents of that application are hereby incorporated by reference in their entirety for all purposes.

TECHNICAL FIELD

The present technology relates to semiconductor processes and equipment. More specifically, the present technology relates to centering and/or leveling a pedestal of a semiconductor processing chamber.

BACKGROUND

Integrated circuits are made possible by processes which produce intricately patterned material layers on substrate surfaces. As device sizes continue to shrink in next-generation devices, uniformity of processing conditions continues to increase in importance, chamber designs and system set-up may have an important role in the quality of devices produced. Thus, there is a need for systems and methods that can be used to produce high quality devices and structures.

SUMMARY

Exemplary apparatuses may include an annular mounting block, a plurality of first gauges, and a plurality of second gauges. The annular mounting may include a central axis, a sidewall about the central axis, and a mounting platform extending radially inward from the sidewall toward the central axis. The plurality of first gauges may be mounted on the mounting platform such that the plurality of first gauges may be oriented substantially parallel to the central axis. The plurality of first gauges may be configured to obtain a first plurality of measurements indicative of relative distances between a plane that may be substantially perpendicular to the central axis of the annular mounting block and measured points. The plurality of second gauges may be mounted on the mounting platform such that the plurality of second gauges may be oriented substantially perpendicular to the central axis and a measuring tip of each second gauge of the plurality of second gauges may extend radially beyond the sidewall of the annular mounting block. The plurality of second gauges may be configured to obtain a second plurality of measurements indicative of relative distances between the central axis of the annular mounting block and measured points.

In some embodiments, the plurality of first gauges may include at least three dial gauges. The plurality of second gauges may include at least three dial gauges. In some embodiments, a measuring tip of each first gauge of the plurality of first gauges may include a flat tip. The measuring tip of each second gauge of the plurality of second gauges may include a roller tip.

In some embodiments, the sidewall of the annular mounting block may be characterized by a plurality of reference surfaces. Each reference surface of the plurality of reference surfaces may be substantially parallel to the central axis of the annular mounting block. Each reference surface of the plurality of reference surfaces may be positioned at an equal distance from the central axis of the annular mounting block. Each second gauge of the plurality of second gauges may be mounted above one reference surface of the plurality of reference surfaces such that the measuring tip of each second gauge of the plurality of second gauges may extend radially beyond the reference surface of the plurality of reference surfaces below.

In some embodiments, the exemplary apparatuses may further include a reference plate. The reference plate may include a raised portion. The raised portion may be characterized by a flat surface. The reference plate may be releasably attached to the mounting platform of the annular mounting block. The annular mounting block may define a recess such that, when the reference plate may be attached to the annular mounting block, the raised portion of the reference plate may be received within the recess of the annular mounting block, and the flat surface may face a floor of the recess and may be suspended from the floor of the recess.

In some embodiments, the exemplary apparatuses may further include a gauge spindle compressor. The gauge spindle compressor may be positionable about the central axis of the annular mounting block. The gauge spindle compressor may define a tapered inner surface. The tapered inner surface may be configured to compress a gauge spindle of each second gauge of the plurality of second gauges when the gauge spindle compressor may be positioned about the central axis of the annular mounting block and the annular mounting block may translate along the central axis of the annular mounting block.

In some embodiments, the exemplary apparatuses may further include a leveling reference plate and a zero setter. The leveling reference plate may be characterized by a first surface, a second surface opposite to the first surface, and a plurality of openings. The zero setter may include a cylindrical body. The cylindrical body may include a plurality of protrusions extending from a first surface of the cylindrical body. Each protrusion of the plurality of protrusions of the zero setter may be configured to be received in an opening of the plurality of openings of the leveling reference plate. Each protrusion of the plurality of protrusions may be characterized by a height dimension that may be less than a thickness dimension of the leveling reference plate defined by the first surface and the second surface of the leveling reference plate such that the plurality of protrusions may not extend beyond the second surface of the leveling reference plate when the plurality of protrusions of the zero setter may be received in the plurality of openings of the leveling reference plate. The zero setter may further include a plate member. The plate member may be supported by the cylindrical body. When the plurality of protrusions of the zero setter may be received in the plurality of openings of the leveling reference plate, the zero setter may be supported by the leveling reference plate such that a first surface of the plate member of the zero setter may be parallel to the first surface of the leveling reference plate.

The present technology may also include exemplary methods. The exemplary methods may include collecting, via a plurality of first dial gauges, a first set of measurements. The first set of measurements may be indicative of relative distances between a plurality of locations at a gas distribution member of a semiconductor processing chamber and a top surface of a pedestal of the semiconductor processing chamber. The exemplary methods may further include adjusting the pedestal to a first position based on the first set of measurements such that the top surface of the pedestal may be substantially parallel to a bottom surface of the gas distribution member.

In some embodiments, the exemplary methods may further include reducing a pressure inside the semiconductor processing chamber toward vacuum prior to collecting the first set of measurements. In some embodiments, the exemplary methods may further include raising the pedestal to position a flat tip of a gauge spindle of each first dial gauge of the plurality of first dial gauges in contact with the bottom surface of the gas distribution member. In some embodiments, the exemplary methods may further include zeroing the plurality of first dial gauges with respect to the top surface of the pedestal.

In some embodiments, the exemplary methods may further include collecting, via a plurality of second dial gauges, a second set of measurements. The second set of measurements may be indicative of relative distances between a plurality of locations at a ring member of the semiconductor processing chamber and a central axis of the pedestal. The exemplary methods may further include adjusting the pedestal to a second position based on the second set of measurements such that the central axis of the pedestal and a central axis of the ring member may be aligned.

In some embodiments, the exemplary methods may further include placing a gauge spindle compressor inside a chamber body of the semiconductor processing chamber. The gauge spindle compressor may include a tapered inner surface. The exemplary methods may also include raising the pedestal to cause a roller tip of a gauge spindle of each second dial gauge of the plurality of second dial gauges to slide along the tapered inner surface and pass the tapered inner surface until the roller tip of the gauge spindle of each second dial gauge of the plurality of second dial gauges may be positioned against an inner surface of the ring member of the semiconductor processing chamber.

In some embodiments, the plurality of first dial gauges and/or the plurality of second dial gauges may be mounted on a mounting block. In some embodiments, the exemplary methods may further include placing the mounting block around the pedestal. The mounting block may include a plurality of protrusions to be received inside a plurality of recesses at the pedestal such that, when the mounting block may be placed around the pedestal, a central axis of the mounting block and the central axis of the pedestal may be aligned.

The present technology may also include additional exemplary apparatuses. The exemplary apparatuses may include a gauge mounting block, a plurality of first gauges, and a plurality of second gauges. The plurality of first gauges may be mounted on the gauge mounting block. The plurality of first gauges may be configured to obtain measurements that may be indicative of a degree of parallelism between a first component of a lid stack of a semiconductor processing chamber and a pedestal of the semiconductor processing chamber. The plurality of second gauges may be mounted on the gauge mounting block. The plurality of second gauges may be configured to obtain measurements that may be indicative of a degree of axial alignment between a second component of the lid stack and the pedestal.

In some embodiments, the semiconductor processing chamber may further include a chamber body. The lid stack may be configured to be opened and closed relative to the chamber body such that a pressure inside the semiconductor processing chamber may be reduced toward vacuum when the lid stack may be closed. The plurality of first gauges may be configured to obtain the measurements that may be indicative of the degree of parallelism between the first component of the lid stack and the pedestal under vacuum. The plurality of second gauges may be configured to obtain the measurements that may be indicative of the degree of axial alignment between the second component of the lid stack and the pedestal under vacuum.

In some embodiments, the gauge mounting block may include a central axis, a sidewall about the central axis, and a mounting platform extending radially inward from the sidewall toward the central axis. The plurality of first gauges and/or the plurality of second gauges may be mounted on the mounting platform. The plurality of second gauges may be oriented substantially perpendicular to the plurality of first gauges.

In some embodiments, the exemplary apparatuses may further include a gauge spindle compressor. The gauge spindle compressor may be configured to be positioned about a central axis of the pedestal. The gauge spindle compressor may include a tapered inner surface. The tapered inner surface may be configured to engage and compress a roller tip of each second gauge of the plurality of second gauges.

In some embodiments, the first component of the lid stack may include a plate member. The degree of parallelism may be determined between a lower surface of the plate member and an upper surface of the pedestal. In some embodiments, the second component of the lid stack may include a ring member.

The present technology may provide numerous benefits over conventional systems and techniques. For example, the present technology may allow a pedestal of a processing chamber to be centered and/or leveled under atmospheric or vacuum conditions. The present technology may transmit measured data wirelessly and/or using wired connections to a remote computer outside the processing chamber for an operator to center and/or level the pedestal. The present technology can achieve resolution and/or accuracy comparable to conventional systems and techniques, but may significantly reduce cost. These and other embodiments, along with many of their advantages and features, may be described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 5A shows a top perspective view of an exemplary reference plate of the exemplary apparatus illustrated in FIGS. 4A and 4B according to embodiments of the present technology.

FIG. 5B shows a bottom perspective view of the reference plate illustrated in FIG. 5A.

FIG. 6A shows a top perspective view of an exemplary zero setter of the exemplary apparatus illustrated in FIGS. 4A and 4B according to embodiments of the present technology.

FIG. 6B shows a bottom perspective view of the zero setter illustrated in FIG. 6A.

FIG. 6C shows a perspective cross-sectional view of the zero setter illustrated in FIG. 6A.

FIG. 7A shows a perspective cross-sectional view of an exemplary gauge spindle compressor of the exemplary apparatus illustrated in FIGS. 4A and 4B according to embodiments of the present technology.

FIG. 7B shows an enlarged view of a portion of the gauge spindle compressor illustrated in FIG. 7A.

Figure 1:
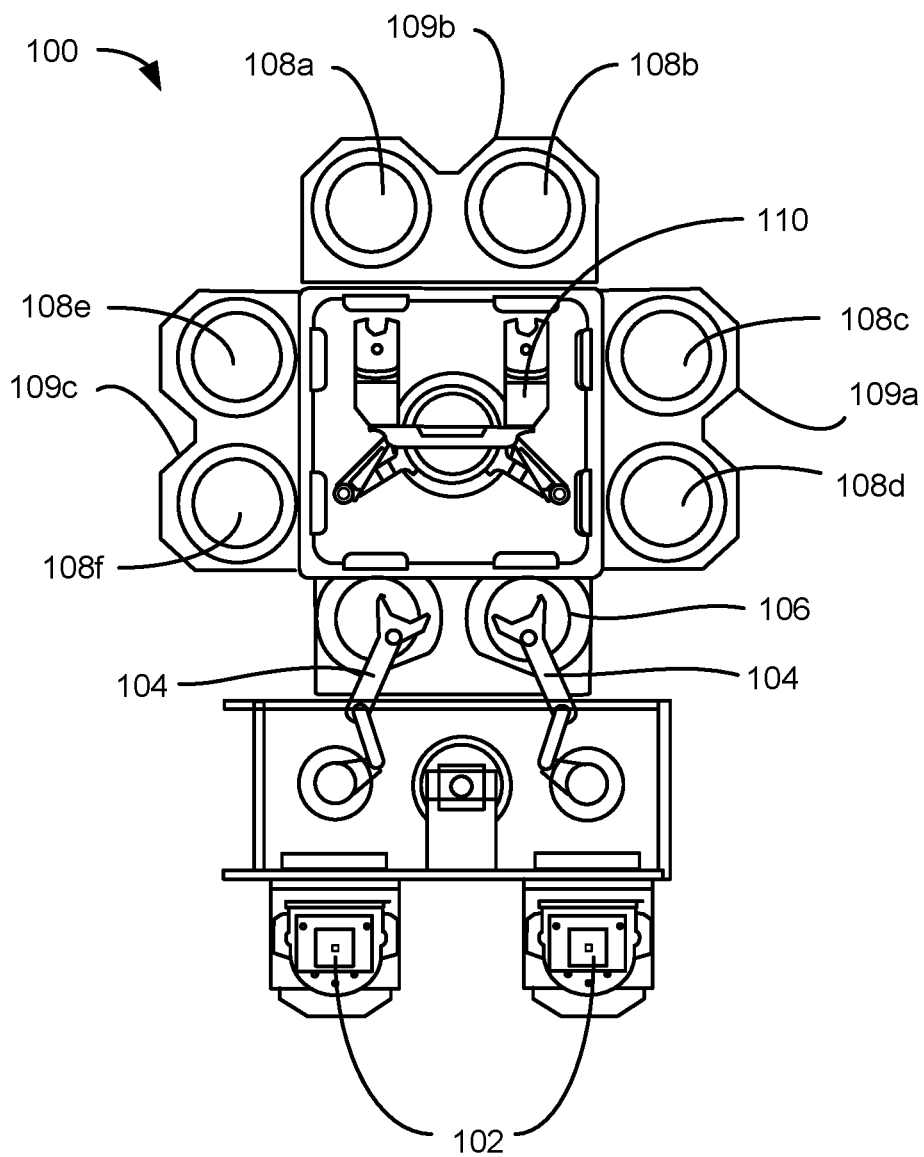
FIG. 1 shows a top plan view of one embodiment of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor processing, etching and/or deposition uniformity may be sensitive to the axial alignment between a pedestal in the chamber body, on which a substrate may be placed for processing, and lid stack components through which various processing gases and precursors may be delivered and/or distributed into the chamber and onto the substrate. The etching and/or deposition uniformity may also be sensitive to the parallelism between the pedestal and the gas distribution components in the lid stack.

Some conventional tools may center the pedestal with respect to the chamber body and/or may level the pedestal with respect to a top surface of the chamber body under atmospheric conditions. However, the lid stack may be hinged to the chamber body and may be opened and closed relative to the chamber body. When the lid stack may be closed, the gas distribution components of the lid stack may not be axially aligned with the chamber body and/or parallel to the top surface of the chamber body. Consequently, the gas distribution components of the lid stack components may not be axially aligned with and/or parallel to the pedestal, affecting processing uniformity. Further, when the chamber pressure may be reduced to vacuum, movement of components during the pumping process may also affect the axial alignment and parallelism between the gas distribution components and the pedestal.

Some conventional technologies utilizing capacitance based sensors may center or level the pedestal under vacuum. However, the cost for capacitance based sensors and the related centering and/or leveling technologies can be very high. Further, data wires may be required in some conventional technologies to transmit measurements obtained by the capacitance based sensors to an operator's device outside the processing chamber.

The present technology overcomes these issues by utilizing dial gauges that may be configured to determine the parallelism between the pedestal and the gas distribution components in the lid stack and/or to determine the axial alignment therebetween. The present technology may transmit the measured data wirelessly to a remote computer for an operator to center and/or level the pedestal. The present technology may allow the pedestal of the processing chamber to be centered and/or leveled under atmospheric or vacuum conditions. The present technology can achieve resolution and/or accuracy comparable to conventional capacitance basis sensors, but may reduce the cost by at least 70% or more.

Although the remaining disclosure will routinely identify centering and/or leveling specific components of a processing chamber with respect to other components of the processing chamber utilizing the disclosed technology, the technology should not be considered to be so limited as for centering and/or leveling the identified components only. Moreover, although exemplary semiconductor processing chambers are described to aid understanding of the present technology, the technology should not be considered to be so limited as for centering and/or leveling components of semiconductor processing chambers only or to the exemplary chamber described. It is to be understood that the present technology can be utilized for any type of processing chamber, as well as other applications where centering and/or leveling components may be beneficial.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric or metallic film on the substrate wafer. In one configuration, two pairs of the processing chambers, e.g., 108c-d and 108e-f, may be used to deposit material on the substrate, and the third pair of processing chambers, e.g., 108a-b, may be used to etch the deposited material. In another configuration, all three pairs of chambers, e.g., 108a-f, may be configured to etch a dielectric or metallic film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
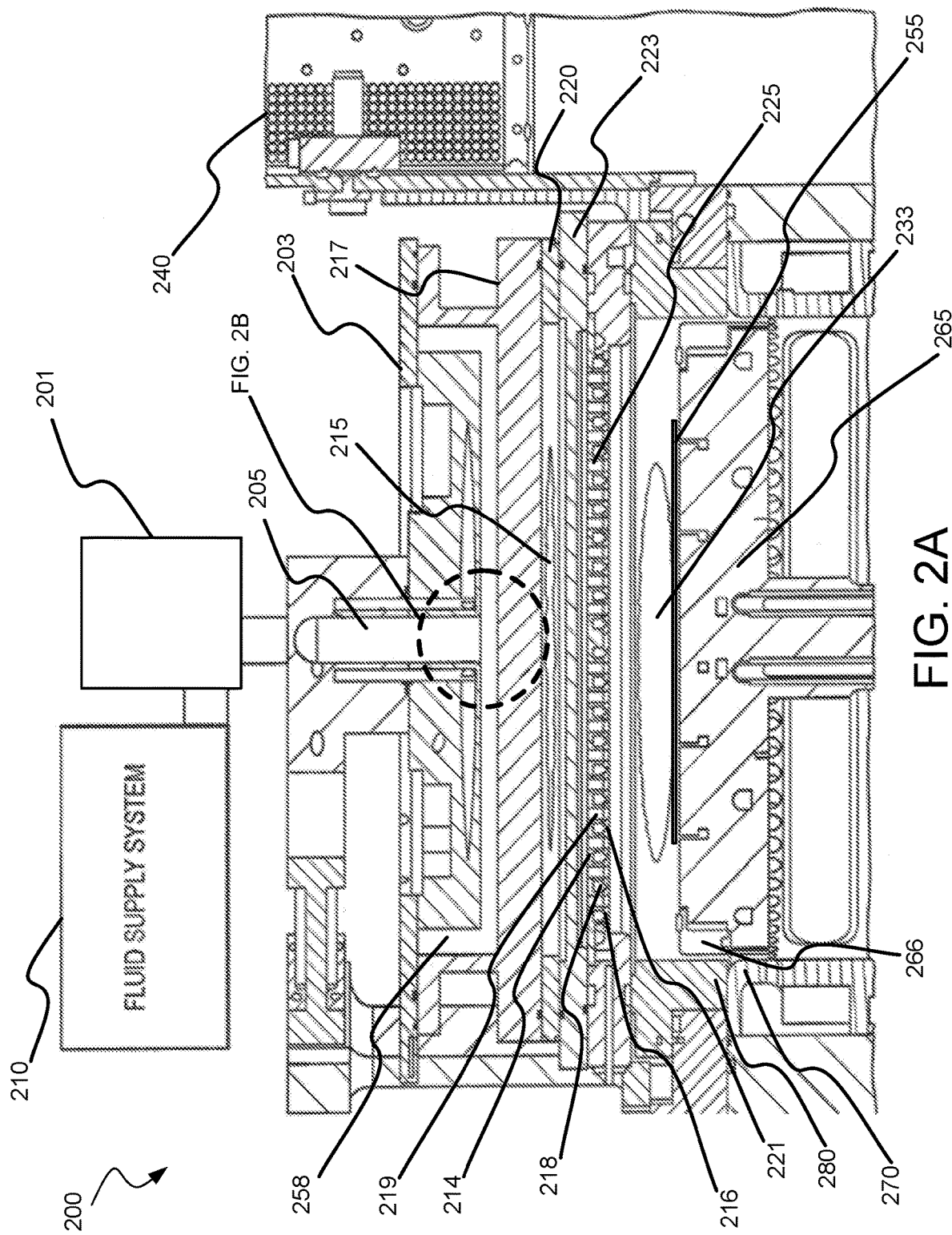
FIG. 2A shows a schematic cross-sectional view of an exemplary processing chamber according to embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, copper, cobalt, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a substrate support or pedestal 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 600° C., using an embedded resistive heater element. The pedestal 265 may include an edge ring 266 positioned on a recessed ledge of the pedestal 265.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., $SiN_x:SiO_x$ etch ratios, $Si:SiO_x$ etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

As shown in FIG. 2A, during processing the pedestal 265 may be raised so that a top surface of the pedestal 265 and the substrate 255 supported thereon may be raised above a pumping liner 270 of the processing chamber 200. The substrate 255 may be enveloped or surrounded by a spacer ring 280 of the processing chamber 200 for processing. The spacer ring 280 and various components on or above the spacer ring 280, such as the cooling plate 203, the faceplate 217, the ion suppressor 223, the showerhead 225 and so on, may be assembled in a lid stack of the processing chamber 220, and may be centered with respect to an axis of the lid stack or a common axis of the various lid stack components. The pumping liner 270 and various components below the pumping liner 270, including the pedestal 265 may be assembled in a chamber body of the processing chamber 200 and may be centered with respect to an axis of the chamber body or a common axis of the various chamber body components. During processing, the axis of the chamber body and the axis of the lid stack may be aligned such that the pedestal 265 and the substrate 255 supported thereon may be centered and/or parallel to the faceplate 217, the ion suppressor 223, and/or the showerhead 225 to achieve uniform processing.

Figure 2B:
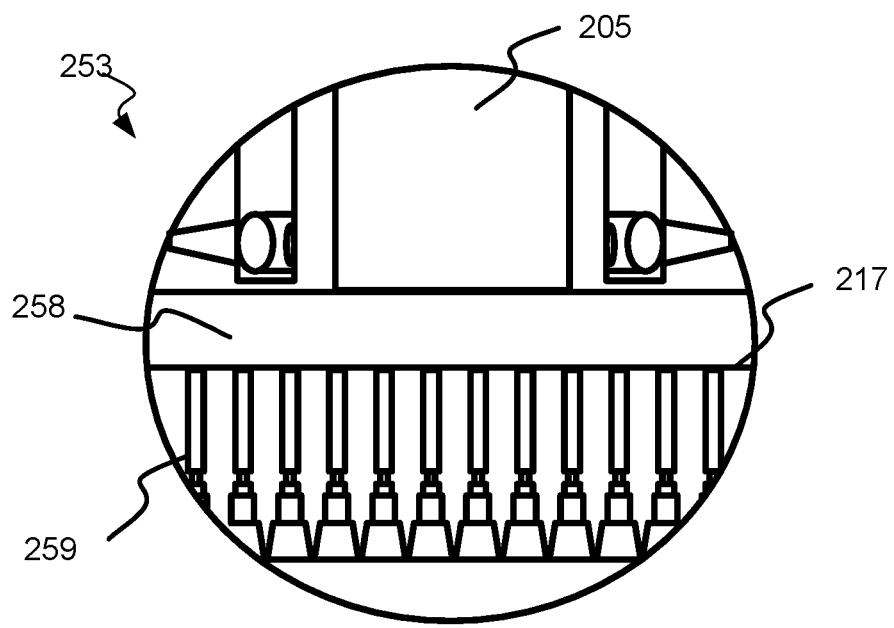
FIG. 2B shows a detailed view of a portion of the processing chamber illustrated in FIG. 2A according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
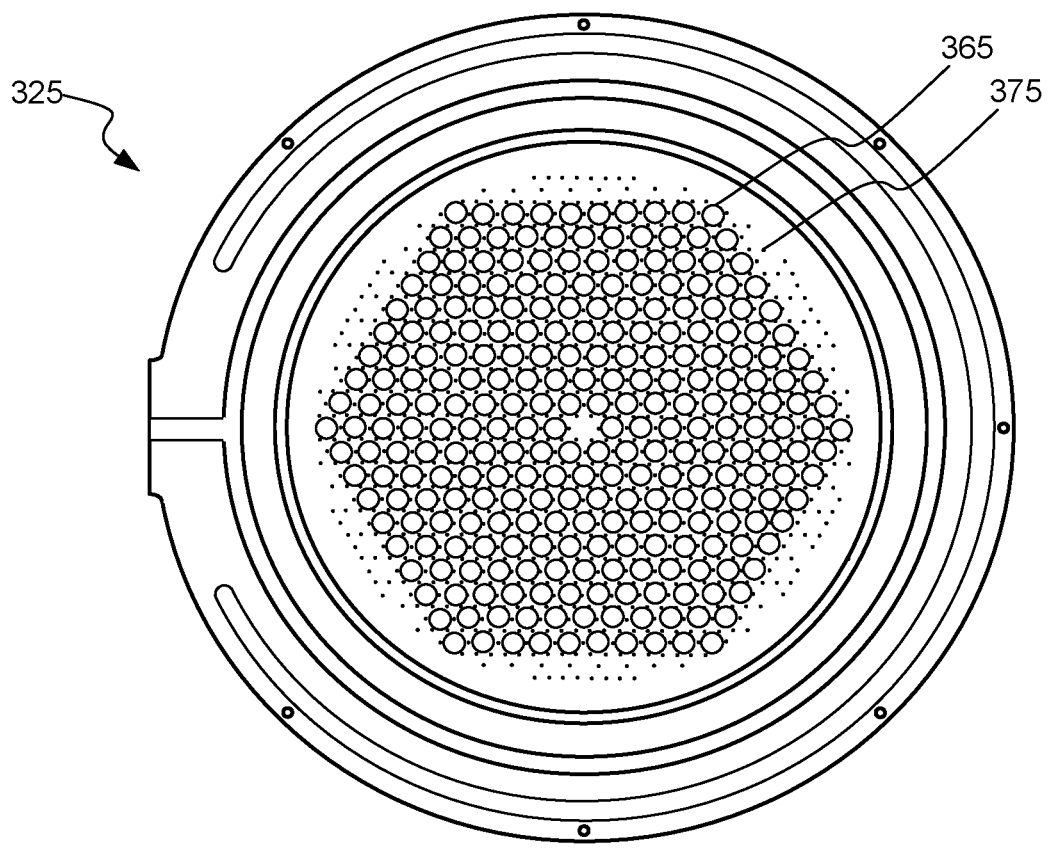
FIG. 3 shows a bottom plan view of an exemplary showerhead according to embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4A:
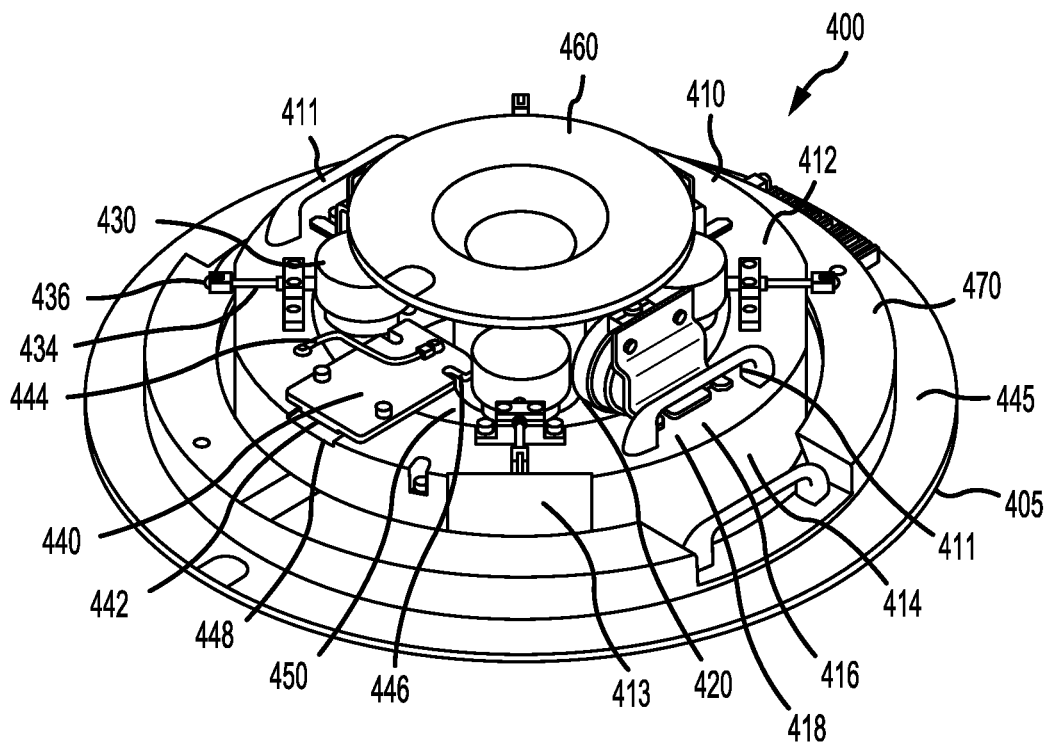
FIG. 4A shows a perspective view of an exemplary apparatus for centering and/or leveling a pedestal of a processing chamber according to embodiments of the present technology.
Figure 4B:
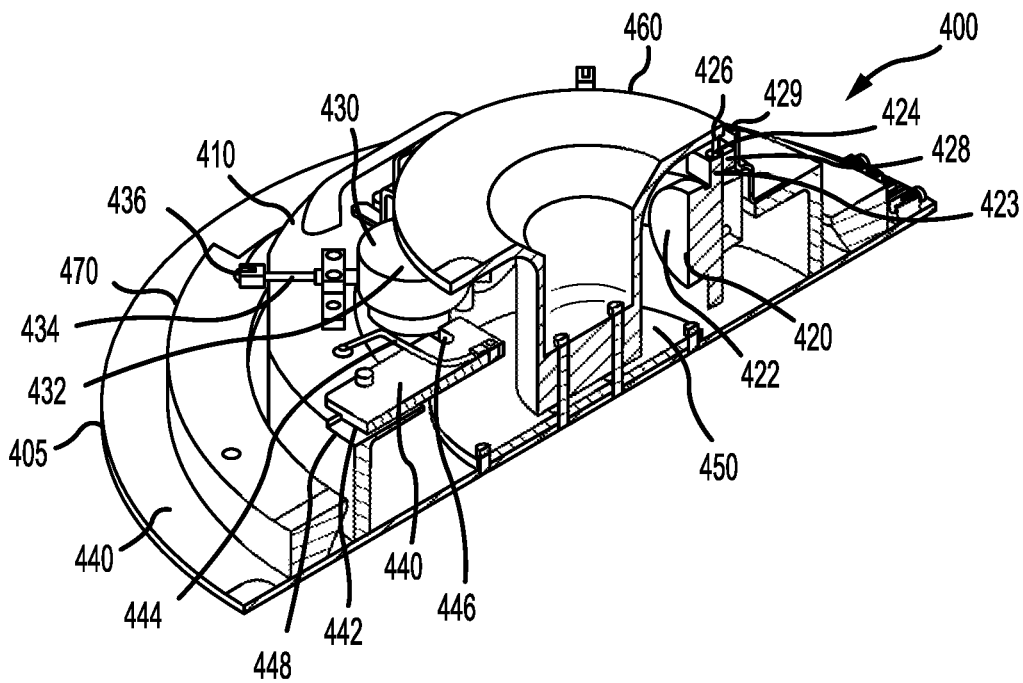
FIG. 4B shows a cross-sectional view of the apparatus illustrated in FIG. 4A.

FIG. 4A shows a perspective view of an apparatus 400 that includes various components for centering and/or leveling a pedestal of a processing chamber according to embodiments of the present technology. FIG. 4A illustrates that the various components of the apparatus 400 may be placed on a component holder 405 for storage when not used for centering and/or leveling a pedestal of a processing chamber. FIG. 4B shows a cross-sectional view of the apparatus 400 illustrated in FIG. 4A. The apparatus 400 may include a gauge mounting block 410 having mounted thereon a set of first gauges 420 configured for leveling a pedestal of a processing chamber and a set of second gauges 430 configured for centering the pedestal, a centering reference plate 440, a leveling reference plate 450, a zero setter 460, and a gauge spindle compressor 470. The set of first gauges 420 may also be referred to as the set of leveling gauges 420, and the set of second gauges 430 may also be referred to as the set of the centering gauges 430.

With further reference to FIGS. 4A and 4B, the gauge mounting block 410 may be or include an annular body 412 having a central axis. The annular body 412 may include a sidewall 414 about the central axis and an annular ledge 416 radially extending inward from the sidewall 414 toward the central axis. The annular ledge 416 may define a mounting platform 418 on which the set of first gauges 420 and the set of second gauges 430 may be mounted. As will be the described in more detail below, when mounted, the set of first gauges 420 may be positioned radially inward from the annular ledge 416 of the gauge mounting block 410 and may be oriented substantially parallel to the central axis of the gauge mounting block 410. The set of second gauges 430 may be oriented substantially perpendicular to the central axis of the gauge mounting block 410, and a measuring tip 436 of each of the set of second gauges 430 may extend radially beyond the sidewall 414 of the gauge mounting block 410. The gauge mounting block 410 may further include a pair of handles 411.

The sidewall 414 of the gauge mounting block 410 may include a set of reference surfaces 413. The set of reference surfaces 413 may be configured at 90 degree intervals from each other, but may be configured at any other suitable intervals. Each of the set of reference surfaces 413 may be controlled to be flat or substantially flat. Each of the set of reference surfaces 413 may be substantially parallel to the central axis of the gauge mounting block 410. The distances from the central axis of the gauge mounting block 410 to each of the set of reference surfaces 413 may be controlled to be same or substantially same such that each of the set of reference surfaces 413 may be positioned at an equal distance from the central axis of the gauge mounting block 410. The set of reference surfaces 413 may be used to set zeros for the set of second gauges 430 as will be discussed in more detail below.

With reference to FIG. 4B, each of the set of first gauges 420 may include a dial gauge which may include a gauge body 422, a compressible spindle 424 coupled to the gauge body 422, and a measuring tip 426 disposed at the end of the spindle 424. The set of first gauges 420 may be configured to obtain measurements indicative of relative distances between a plane that is substantially perpendicular to the central axis of the gauge mounting block 410 and measured points or the measuring tip 426 of each of the set of first gauges 420. The measurements obtained by the set of first gauges 420 may be transmitted to a remote computer outside the chamber. In some embodiments, the measurements may be transmitted to the remote computer outside the chamber wirelessly. In some embodiments, each first gauge 420 may include components that may allow the measurements to be transmitted wirelessly to a remote computer using Bluetooth® or other wireless technology. In some embodiments, the measurements obtained by the set of first gauges 420 may be collected by a data collecting module or component inside the chamber, through either a wired connection or a wireless connection with each of the first gauges 420. The collected measurements may then be transmitted to the remote computer outside the chamber by the data collecting module wirelessly. The data collecting module may be configured to transmit the measurements obtained by each first gauge 420 individually or transmit the measurements obtained by all the first gauges 420 collectively as a group. In some embodiments, the measurements obtained by the set of first gauges 420 may be transmitted outside the chamber to a remote computer using wired connections. In some embodiments, the data collecting module may be connected to the remote computer outside the chamber via wired connections. In some embodiments, the individual first gauges 420 may be connected to the remote computer using data wires. In some embodiments, multiple data wires may be used to connect individual first gauges 420 to the remote computer. In some embodiments, the wired connections between the set of first gauges 420 and the remote computer may be established via a multi-wire cable, such as a multi-wire planar cable or ribbon cable.

The gauge body 422 may further include a neck portion 423 for mounting each first gauge 420 to the gauge mounting block 410 via mounting clamps 428 and a mounting bracket 429. The mounting bracket 429 may include two mounting sections that may be oriented substantially perpendicular to each other. One of the mounting sections may be mounted to the mounting platform 418 of the gauge mounting block 410. The neck portion 423 of each first gauge 420 may be held by the mounting clamps 428 to mount the first gauge 420 to the other one of the two perpendicularly arranged sections of the mounting bracket 429. With this mounting configuration, each of the set of first gauges 420, or an axis thereof as defined by the spindle 424 of each of the set of first gauges 420, may be oriented substantially parallel to the central axis of the gauge mounting block 410. With this orientation, the set of first gauges 420 may be configured to determine parallelism between two planes that may be substantially perpendicular to the central axis of the gauge mounting block 410, such as a plane defined by a bottom surface of a plate member in the lid stack of the processing chamber and a plane defined by the top surface of the pedestal as will be discussed in more detail below. The measuring tip 426 may include a flat tip end so that when the set of first gauges 420 may be used to level the pedestal, the tip end may not extend into apertures defined by the plate member, such as holes 365, 375 shown in FIG. 3.

With continued reference to FIG. 4B, each of the set of second gauges 430 may include a dial gauge which may include a gauge body 432, a compressible spindle 434 coupled to the gauge body 432, and a measuring tip 436 disposed at the end of the spindle 434. The set of second gauges 430 may be configured to obtain measurements that may be indicative of relative distances between the central axis of the gauge mounting block 410 and measured points or tip ends of the measuring tips 436 of the set of second gauges 430. The measurements obtained by the set of second gauges 430 may be transmitted to a remote computer outside the chamber wirelessly and/or via wired connections, similar to the wired and/or wireless transmission of measurements by the set of first gauges 420 to a remote computer discussed above. In some embodiments, each second gauge 430 may include components that may allow the measurements to be transmitted wirelessly to a remote computer. In some embodiments, the measurements obtained by the set of second gauges 430 may be collected by a data collecting module or component inside the chamber. The data collecting module may be configured to collect and/or transmit to the remote computer measurements of each second gauge 430 individually or collectively as a group. The data collecting module for collecting the measurements obtained by the set of second gauges 430 may be the same as or different from the data collecting module for collecting the measurements obtained by the set of first gauges 420. When the same data collecting module may be used for collecting the measurements obtained by the set of first gauges 420 and the set of second gauges 430, the data collecting module may be configured to collect and/or transmit to the remote computer the measurements of each first gauge 420 and each second gauge 430 individually or collectively as a group. The data collecting module may be connected to the second gauges 430 through either a wired connection or a wireless connection. The collected measurements may then be transmitted to the remote computer outside the chamber by the data collecting module wirelessly. In some embodiments, the measurements obtained by the second gauges 430 may be transmitted outside the chamber to the remote computer using wired connections. In some embodiments, the data collecting module may be connected to the remote computer using wired connections. In some embodiments, data wires may be used to connect individual second gauges 430 to the remote computer. In some embodiments, a multi-wire cable, such as a multi-wire planar cable or ribbon cable, may be used to connect the set of second gauges 430 with the remote computer. The set of the second gauges 430 and the set of the first gauges 420 may be connected to the remote computer using a common multi-wire cable or different multi-wire cables.

Wirelessly transmitting the measurements obtained the set of first gauges 420 and/or the set of second gauges 430 may facilitate centering and/or leveling the pedestal under vacuum as will be discussed in more detail below. However, by selecting and/or configuring the wired connections appropriately, centering and/or leveling the pedestal under vacuum may also be achieved. Other various data transmission methods and components may be implemented for transmitting the measurements taken by the set of first gauges 420 and/or the second gauges 430 to the remote computer wirelessly or through wired connections.

Mounting clamps 428 may be used to hold a neck portion 433 of each of the set of second gauges 430 to mount each of the set of second gauges 430 to the mounting platform 418 above one reference surface 413 of the set of reference surfaces 413. When mounted, each of the set of second gauges 430, or an axis thereof as defined by the spindle 434 of each of the set of second gauges 430, may be oriented substantially perpendicular to the reference surface 413 below. The measuring tip 436 of each of the set of second gauges 430 may extend radially beyond the reference surface 413 below. As discussed above, the set of reference surfaces 413 may be substantially parallel to the central axis of the gauge mounting block 410. Accordingly, the set of second gauges 430 may be oriented perpendicular to the central axis of the gauge mounting block 410 and perpendicular to the orientation of the set of first gauges 420. With such configuration, the set of second gauges 430 may be configured to determine axial alignment between two members, such as a ring member in the lid stack of the processing chamber and the pedestal as will be discussed in more detail below. The measuring tip 436 may include a roller tip so that when the set of second gauges 430 may be used to centering the pedestal as will be discussed below, the measuring tips 436 of the set of second gauges 430 may slide along surfaces of various components inside the processing chamber without being caught in the gaps between the various components.

The set of first gauges 420 may include three of the first gauges 420. The set of second gauges 430 may include four of the second gauges 430. The first gauges 420 and the second gauges 430 may be mounted in an alternating manner. The four second gauges 430 may be mounted on the gauge mounting block 410 at about 90 degree intervals. The first gauges 420 may each be mounted between two adjacent second gauges 430 and also at about 90 degree intervals. Although three first gauges 420 and four second gauges 430 are described as examples, the apparatus 400 may include more than three first gauges 420, and/or the apparatus 400 may include three or more than four second gauges 430. The first and second gauges 420, 430 may be spaced apart by any degrees of intervals. The first and/or second gauges 420, 430 may be spaced apart by same or different degrees of intervals. The first and second gauges 420, 430 may be arranged in a non-alternating manner or arranged in any order or sequence.

With further reference to FIGS. 4A and 4B, the centering reference plate 440 may include a raised portion that may be characterized by a surface 442 that may be controlled to be flat or substantially flat. The surface 442 may be used to set zero of each of the set of second gauges 430 as will be discussed in more detail below. The centering reference plate 440 may be releasably attached or mounted onto the mounting platform 418 of the gauge mounting block 410 using fasteners or other securing mechanism. In some embodiments, a tether 444 may be used to prevent accidental loss of the centering reference plate 440. A length of the tether 444 may be configured to allow the centering reference plate 440 to reach each of the set of second gauges 430 for zeroing the second gauges. The centering reference plate 440 may include grooves 446 for wrapping the tether 444. The mounting platform 418 may define a recess 448 for receiving the raised portion of the centering reference plate 440. The recess 448 may be characterized by a depth dimension such that, when the raised portion of the centering reference plate 440 may be received within the recess 448, the surface 442 of the centering reference plate 440 may be suspended from a floor of the recess 448 to avoid damages to the surface 442 and to maintain the flatness thereof.

With reference to FIGS. 5A and 5B, the levelling reference plate 450 may include or be a thin, circular plate, although the leveling reference plate 450 may take any other suitable shape. The leveling reference plate 450 may be used with the zero setter 460 to set zero for each of the set of first gauges 420 as will be discussed in more detail below. The leveling reference plate 450 may include a first side 502 and a second side 504 opposite to the first side 502. The first side 502 may define a first surface 505, and the second side 504 may define a second surface 510. The first surface 505 and the second surface 510 may be controlled to be flat or substantially flat such that a high degree of parallelism between the first surface 505 and the second surface 510 may be achieved. The flatness of the first surface 505 and second surface 510 and the parallelism therebetween may facilitate leveling a pedestal of a processing chamber as will be discussed in more detail below.

The first side 502 may further include a pair of first protrusions or bosses 515a and a pair of second protrusions 520a, 520b. The pair of first protrusions 515a, 515b and the pair of second protrusions 520a, 520b may have the same or substantially the same height to support the leveling reference plate 450 on a supporting surface when the leveling reference plate 450 may not be used. For example, when the leveling reference plate 450 may be stored, the leveling reference plate 450 may be supported by the pair of first protrusions 515a, 515b and the pair of second protrusions 520a, 520b on a supporting surface 445 of the component holder 405 as shown in FIG. 4B. With this configuration, the first surface 505 of the leveling reference plate 450 may face the supporting surface 445 of the component holder 405 but may not be in contact with the supporting surface 445. Any scratches or other damage to the first surface 505 may be minimized or prevented, and the flatness or substantial flatness of the first side 502 may be maintained. The pair of first protrusions 515a, 515b may each define a through hole 517a, 517b through which fasteners, such as bolt fasteners, may be placed for securing the leveling reference plate 450 to the component holder 405. To prevent any scratches or other damage to the second surface 510 that may be caused by the fasteners, the second side 504 may include two recesses 518a, 518b configured to receive the head of the bolt fasteners such that the flatness of the second surface 510 may be maintained.

The pair of first protrusions 515a, 515b may be positioned adjacent a periphery of the leveling reference plate 450. The pair of first protrusions 515a, 515b may be positioned diametrically or diagonally opposite to each other at the circumferential edge of the leveling reference plate 450, such as shown in FIG. 5A, but may be positioned at other suitable locations. The pair of second protrusions 520a, 520b may be positioned relatively closer to the center of the leveling reference plate 450. The pair of second protrusions 520a, 520b may be diametrically or diagonally positioned to each other, such as shown in FIG. 5A, but may be positioned at any suitable location on the first side 502. The pair of second protrusions 520a, 520b may be radially aligned with the pair of first protrusions 515a, 515b, such as shown in FIG. 5A, but may not be radially aligned with the pair of first protrusions 515a, 515b in other embodiments. The pair of second protrusions 520a, 520b may support the weight of the zero setter 460 that may be placed at a central region of the leveling reference plate 450 during storage, such as shown in FIG. 4B. The pair of second protrusions 520a, 520b may each define an through hole 522a, 522b. The through holes 522a, 522b may be configured to align with two through holes of the zero setter 460, as will be discussed in more detail below, such that two fasteners may be placed through the through holes 522a, 522b and the through holes of the zero setter 460 for securing the zero setter 460 on the leveling reference plate 450 and the component holder 405 as shown in FIG. 4B.

The leveling reference plate 450 may define a pair of openings 525a, 525b and a center through hole 530. As will be discussed in more detail below, the center through hole 530 may be utilized by an operator to visually determine the placement of the leveling reference plate 450 on the pedestal, and the pair of openings 525a, 525b may be configured to receive a pair of protrusions of the zero setter 460, as will be discussed below, when the leveling reference plate 450 and the zero setter 460 may be used for leveling the pedestal of the processing chamber.

Although a pair of first protrusions 515a, 515b, a pair of second protrusions 520a, 520b, and a pair of openings 525a, 525b are described as examples, the leveling reference plate 450 may include one or more than two first protrusion 515, one or more than two second protrusions, one or more than two openings 525 in various embodiments.

The second side 504 of the leveling reference plate 450 does not include protrusions such that when the leveling reference plate 450 may be placed on the pedestal, the second side 504 of the leveling reference plate 450 may face and be in direct contact with the pedestal for leveling the pedestal as will be discussed in more detail below. Because the leveling reference plate 450 may be placed on and in direct contact with the top surface of the pedestal, to protect the pedestal, the leveling reference plate 450 may be made of a relatively soft material. In some embodiments, the leveling reference plate 450 may be made of plastic, such as any thermoplastics including polyetherimide, polyether ether ketone, among other polymerized materials, but other material that may be softer than the pedestal material may be used.

With reference to FIGS. 6A and 6B, the zero setter 460 may include a cylindrical body 610 and a plate member 630 supported by the cylindrical body 610 when the zero setter 460 may be placed on the leveling reference plate 450 during storage or usage. In some embodiments, the cylindrical body 610 and the plate member 630 may be formed as a unitary body, and the cylindrical body 610 may transition to the plate member 630 via a tapered portion 650. The zero setter 460 and the leveling reference plate 450 may be configured to set zero for each of the set of first gauges 420 as will be discussed in more detail below.

With further reference to FIG. 6B, the cylindrical body 610 may include a first or bottom side 611. The first side may include a first or bottom surface 614, a pair of protrusions 612a, 612b extending from the first surface 614, and a pair of recesses 616a, 616b formed in the first surface 614. The first surface 614 of the cylindrical body 610 may be controlled to be flat or substantial flat. The pair of protrusions 612a, 612b may be configured to be received in the pair of openings 525a, 525b of the leveling reference plate 450 when the zero setter 460 may be placed on the first surface 505 of the leveling reference plate 450 for zeroing the set of first gauges 420 for leveling the pedestal as will be discussed in more detail below. Each of the pair of protrusions 612a, 612b may be characterized by a height dimension that may be less than a thickness dimension of the leveling reference plate 450 defined by the first surface 505 and the second surface 510 of the leveling reference plate 450. With this configuration, when the pair of protrusions 612a, 612b of the zero setter 460 may be received in the pair of openings 525a, 525b of the leveling reference plate 450, the protrusions 612 may not extend beyond the second surface 510 of the leveling reference plate 450 so as to prevent the protrusions 612 from scratching the pedestal surface. When the zero setter 460 may be positioned on the first surface 505 of the leveling reference plate 450, the pair of second protrusions 520a, 520b on the first surface 505 of the leveling reference plate 450 may be received in the pair of recesses 616a, 616b of the zero setter 460.

The pair of protrusions 612a, 612b may each be formed with a through hole 618a, 618b that may be aligned with one of the through hole 522a, 522b formed in the leveling reference plate 450. When the leveling reference plate 450 and the zero setter 460 may be stored, the zero setter 460 may be placed on the second surface 510 of the leveling reference plate 450 with the through holes 618a, 618b of the zero setter 460 aligned with the through holes 522a, 522b of the leveling reference plate 450. Fasteners may then be placed in the through holes 618a, 618b and the through holes 522a, 522b from a second side 620 of the zero setter 460 as shown in FIG. 6C to secure the zero setter 460 to the leveling reference plate 450 and the component holder 405 as shown in FIG. 4B. During storage, because zero setter 460 may be supported by the pair of protrusions 612a, 612b on the second surface 510 of the leveling reference plate 450, the first surface 614 of the cylindrical body 610 of the zero setter 460 and the second surface 510 of the leveling reference plate 450 may not contact each other. The flatness or substantial flatness of the first surface 614 of the cylindrical body 610 and the second surface 510 may be maintained to facilitate leveling the pedestal as will be discussed in more detail below.

Although pairs of protrusions 612a, 612b and recesses 616a, 616b are described as exemplary configurations, the cylindrical body 610 may be configured with more or fewer number of protrusions 612 and/or recesses 616. The leveling reference plate 450 and the zero setter 460 may be formed with any number of protrusions 612 and corresponding openings 525, any number of second protrusions 520 and corresponding recesses 616, and/or any corresponding number of through holes 522, 618.

With further reference to FIG. 6B, the plate member 630 may include a first or bottom surface 632. The first surface 632 of the plate member 630 may be controlled to be flat or substantially flat. The zero setter 460 may be configured such that the first surface 632 of the plate member 630 may be parallel or substantially parallel to the first surface 614 of the cylindrical body 610. The flatness or substantial flatness of the first surface 632 of the plate member 630 and the first surface 614 of the cylindrical body 610 and the parallelism or substantial parallelism therebetween may facilitate zeroing the set of first gauges. When the zero setter 460 may be placed on the leveling reference plate 450 for zeroing the set of first gauges, the zero setter 460 may be placed on the second surface 510 of the leveling reference plate 450, and the first surface 632 of the plate member 630 may face the second surface 510 and the pedestal as will be discussed in more detail below.

With reference to FIG. 7A, the gauge spindle compressor 470 may include an annular member 710 and two handles 730 (only one shown in FIG. 7A). The annular member 710 may include a first or upper surface 712 and a second or lower surface 714 opposite to the first surface 712. The gauge spindle compressor 470 may further define two recesses 716 (only one shown in FIG. 7A) in the first surface 712 of the annular member 710. The handles 730 may be received in the recesses 716 and secured to a floor of each of the recesses 716, and the handles 730 may not protrude beyond the first surface 712 of the annular member 710. Although two recesses 716 and two handles 730 are described as examples, any number of recesses and/or handles may be included in various embodiments.

With reference to FIG. 7B, the annular member 710 may further include a third or outer surface 718 and a fourth or tapered inner surface 720. The tapered inner surface 720 may be configured to be tapered outwardly toward the second surface 714 of the annular member 710. The tapered inner surface 720 may be configured to compress the set of second gauges 430 when the gauge spindle compressor 470 may be positioned inside the processing chamber for centering and/or leveling the pedestal as will be discussed in more detail below. The annular member 710 may further include a fifth or non-tapered surface portion 722 that may be aligned with an inner surface of a ring member in a lid stack of the processing chamber as will be discussed in more detail below.

Figure 8:
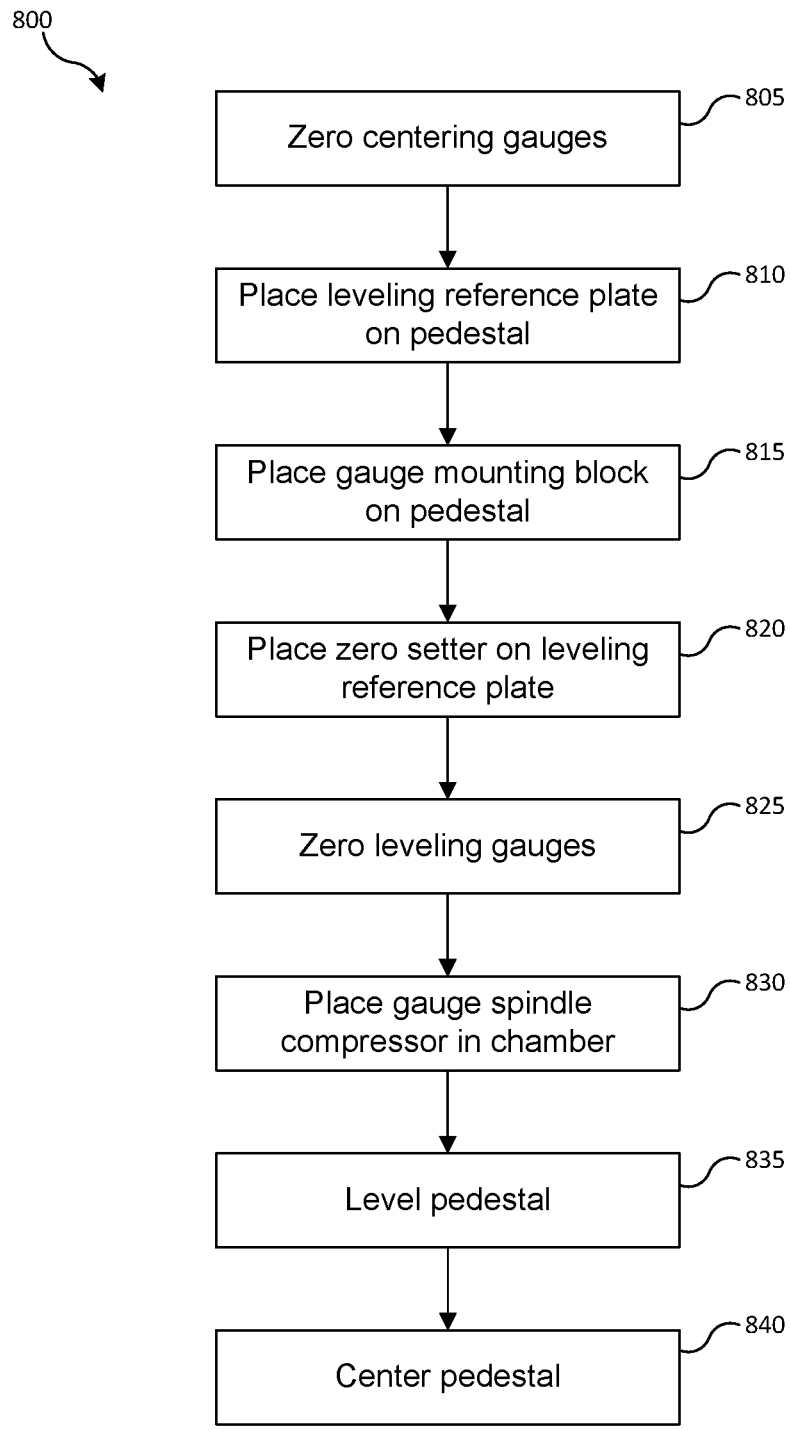
FIG. 8 shows exemplary operations in a method for centering and/or leveling a pedestal of a processing chamber according to embodiments of the present technology.

FIG. 8 illustrates exemplary operations in a method 800 for centering and/or leveling a pedestal of a processing chamber, which will be described in conjunction with the illustrations in FIGS. 9A-9H. Method 800 may use various components of the apparatus 400 described above to center and/or level the pedestal. The processing chamber may be similar to the exemplary processing chamber 200 described above with reference to FIG. 2A. The processing chamber may include a chamber body and a lid stack. The lid stack may be configured to be opened and closed relative to the chamber body such that a pressure inside the processing chamber can be reduced toward vacuum when the lid stack may be closed. The pedestal may be positioned inside the chamber body. The lid stack may include one or more plate members, such as faceplate, showerhead, or other gas distribution assembly. The lid stack may further include one or more cylindrical members, such as a spacer ring member that may be in contact with the chamber body when the lid stack may be closed.

Figure 9A:
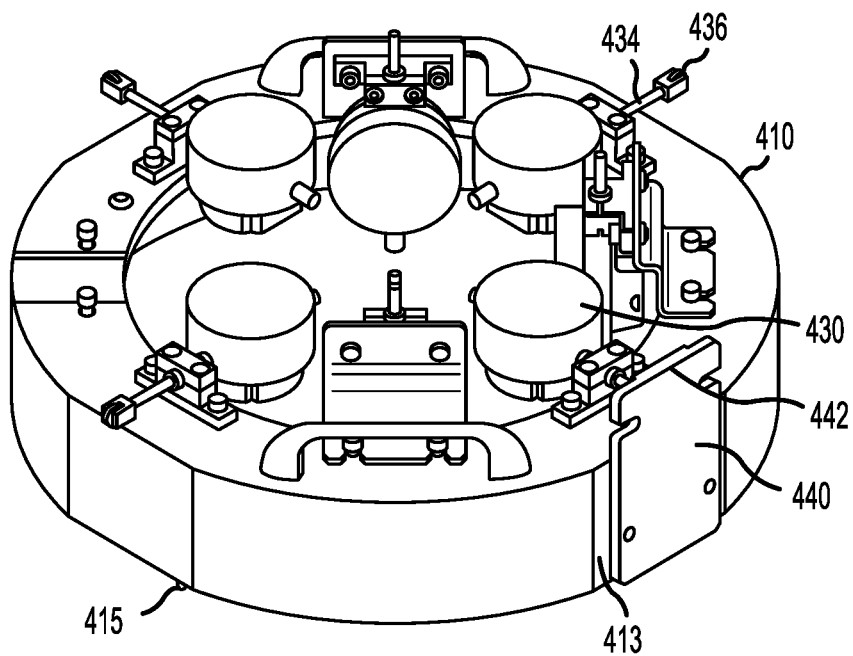
FIGS. 9A-9H illustrates select operations of the method of FIG. 8 using various components of the exemplary apparatus illustrated in FIGS. 4A and 4B according to embodiments of the present technology.

At operation 805, method 800 may begin by zeroing the set of second gauges 430, also referred to as the set of centering gauges 430. With reference to FIG. 9A, the surface 442 of the centering reference plate 440 may be brought into contact with one reference surface 413 of the set of reference surfaces 413 to zero the second gauge 430 positioned above the one reference surface 413. As mentioned above, the measuring tip 436 of each of the set of second gauges 430 may be configured to extend radially beyond the reference surface 413 below. Consequently, when the surface 442 of the centering reference plate 440 may contact the reference surface 413, the surface 442 of the centering reference plate 440 may also contact the measuring tip 436 (blocked from view by the centering reference plate 440) of the second gauge 430 above the reference surface 413 and may compress the spindle 434 (blocked from view by the centering reference plate 440) of the second gauge 430. The second gauge 430 may be set to read zero while being compressed by the reference surface 413. The same operation may be performed for each second gauge 430 of the set of second gauges 430.

Once the set of second gauges 430 may be zeroed, measurements made thereafter may represent distances between measured points and the reference surface 413 below the second gauge 430 taking the measurements. As discussed above, the set of reference surfaces 413 may be controlled such that each reference surface 413 of the set of reference surfaces 413 may be positioned at an equal distance from the central axis of the gauge mounting block 410. Consequently, the measurement may indicate relative distances between the measured points and the central axis of the gauge mounting block 410. As will be discussed in more detail below, the gauge mounting block 410 may be placed on a pedestal such that the central axis of the gauge mounting block 410 may be aligned with the central axis of the pedestal. Consequently, the measurements may also be indicative of relative distances between the measured points and the central axis of the pedestal.

Figure 9B:
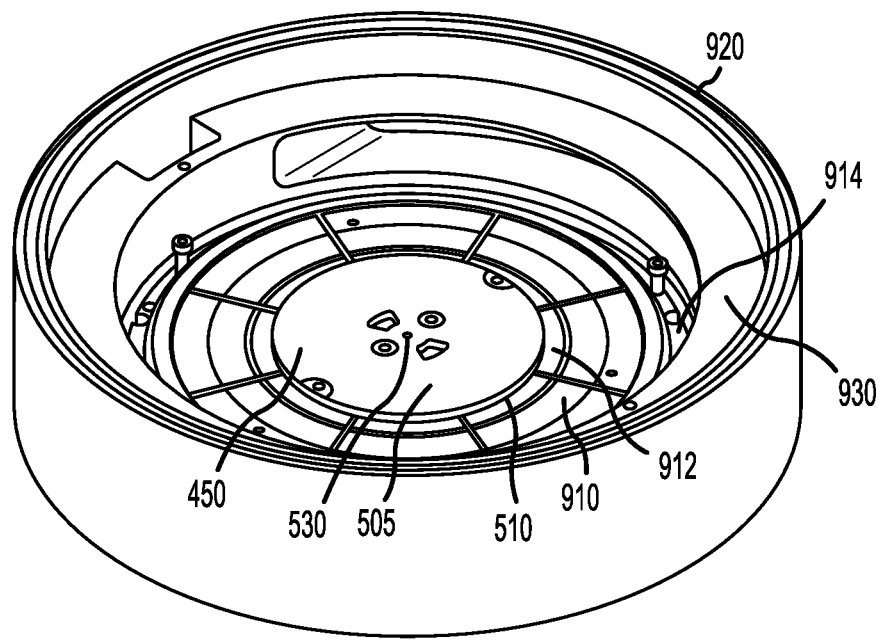

At operation 810, the leveling reference plate 450 may be placed on the pedestal 910 inside a chamber body 920 of a processing chamber as shown in FIG. 9B. The center through hole 530 of the leveling reference plate 450 may be used to visually position the leveling reference plate 450 at about a center location on the pedestal 910. Before operation 810, the lid stack (not shown in FIG. 9B) of the processing chamber may be opened, and a pumping liner, similar to the pumping liner 270 discussed above with reference to FIG. 2A, may be removed from the chamber body 920. An edge ring of the pedestal 910, similar to the edge ring 266 discussed above with reference to FIG. 2A, may also be removed from the pedestal 910 such that the gauge mounting block 410 may be subsequently placed on a recessed ledge 914 of the pedestal 910. A pumping channel 930, on which the pumping liner may rest during substrate processing, is shown in FIG. 9B.

When placed on the pedestal 910, the second surface 510 of the leveling reference plate 450 may face and be in direct contact with the pedestal 910. As discussed above, the second surface 510 may be controlled to be flat or substantially flat, and the first surface 505 of the leveling reference plate 450 may be controlled to be flat or substantially flat and to be parallel or substantially parallel to the second surface 510. Consequently, the first surface 505 may be parallel or substantially parallel to a top surface 912 of the pedestal 910.

Figure 9C:
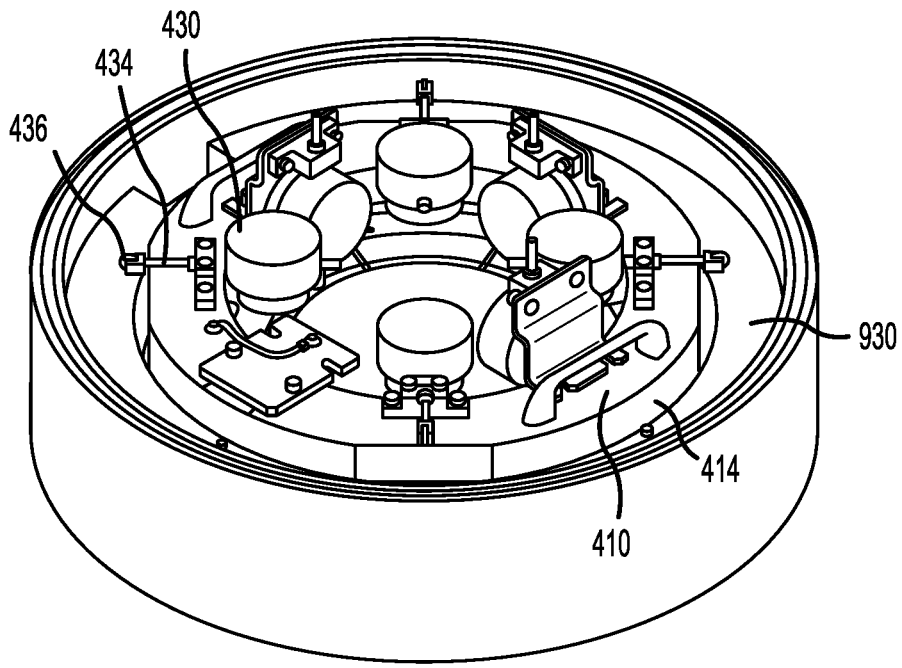

At operation 815, the gauge mounting block 410 may be placed on the pedestal 910 as shown in FIG. 9C. The gauge mounting block 410 may rest on the recessed ledge 914 of the pedestal 910. The recessed ledge 914 may define a number of recesses, such as three, for receiving a corresponding number of locating pins at a bottom surface of the edge ring for positioning the edge ring on the pedestal 910. The gauge mounting block 410 may include a corresponding number of locating pins protruding from a bottom surface of the sidewall 414 of the gauge mounting block 410. One such locating pin 415 can be seen in FIG. 9A protruding from a bottom surface of the sidewall 414. The locating pins of the gauge mounting block 410 may be positioned in a spatial relationship substantially the same as the locating pins of the edge ring such that they may be received in the recesses defined by the recessed ledge 914 of the pedestal 910, and the gauge mounting block 410 may be supported by the recessed ledge 914 of the pedestal 910. Further, the locating pins of the gauge mounting block 410 may be positioned at appropriate locations at the bottom surface of the sidewall 414 such that when the gauge mounting block 410 may be placed on the recessed ledge 914 of the pedestal 910, the central axis of the gauge mounting block 410 and a central axis of the pedestal 910 may be aligned.

When the gauge mounting block 410 may be placed on the pedestal 910, other than the bottom surface of the sidewall 414, other surfaces or components of the gauge mounting block 410 may not be in direct contact with the pedestal 910. Generally, contact between the various components of the apparatus 400 and the chamber components may be controlled or minimized so as to protect the chamber components from being rubbed or scratched, which may generate particles that can contaminate substrates processed in the chamber. To achieve this, an outer diameter of the sidewall 414 of the gauge mounting block 410 may be configured to be less than an inner diameter of the pumping channel 930 as shown in FIG. 9F. With this configuration, a gap may exist between the sidewall 414 and the pumping channel 930 when the gauge mounting block 410 may be placed on the pedestal 910, and an outer surface of the sidewall 414 may not contact the pumping channel 930 or other components of the processing chamber. An inner diameter of the sidewall 414 may be configured to be greater than an outer diameter of a substrate supporting platter 916 such that an inner surface of the sidewall 414 may not contact a side surface 918 of the pedestal 910. As shown in FIG. 9E, the set of first gauges 420 may be mounted such that when the gauge mounting block 410 may be placed on the pedestal 910, a gap may exist between the set of first gauges 420 and the pedestal 910 to prevent the set of first gauges 420 from contacting the top surface 912 of the pedestal 910.

Figure 9D:
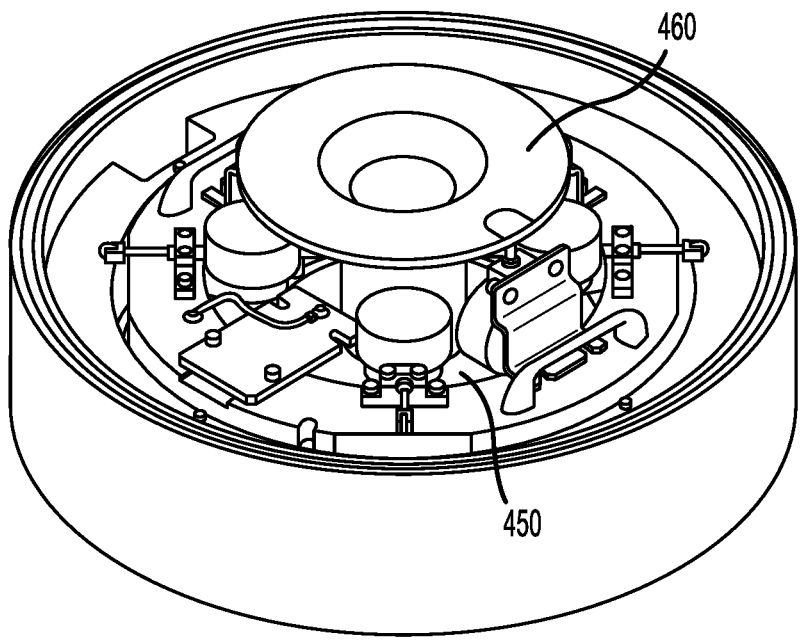
Figure 9E:
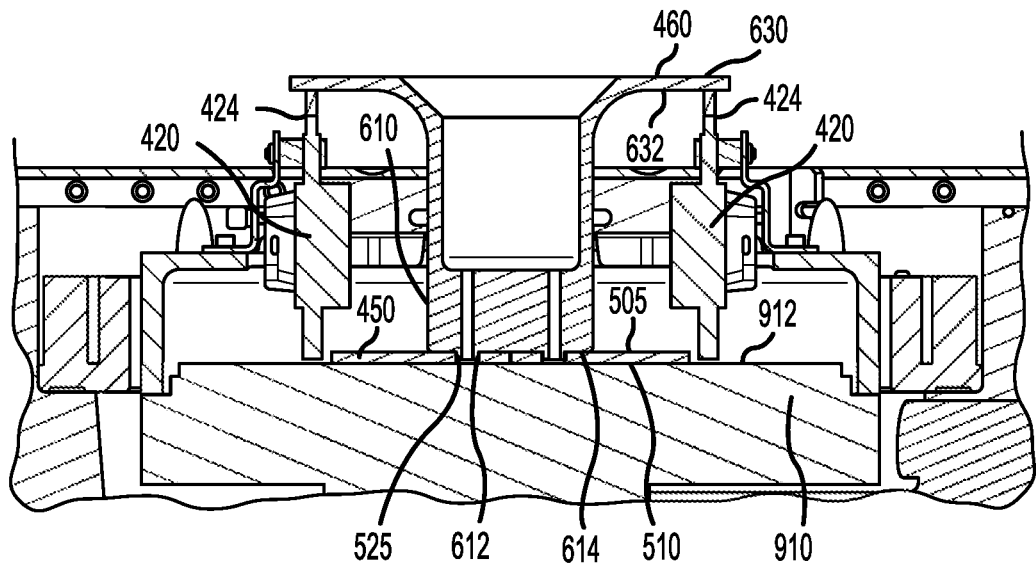
Figure 9F:
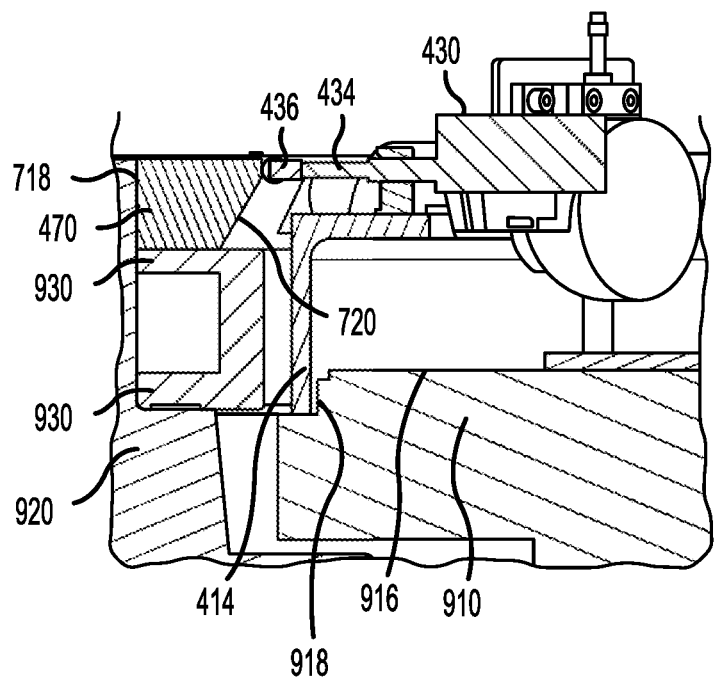

At operation 820, the zero setter 460 may be placed on the leveling reference plate 450 as shown in FIG. 9D. With reference to FIG. 9E, the first surface 614 of the cylindrical body 610 of the zero setter 460 may rest on and be in direct contact with the first surface 505 of the leveling reference plate 450. The pair of protrusions 612 of the zero setter 460 may be placed inside the pair of openings 525 of the leveling reference plate 450. As discussed above, the thickness of the leveling reference plate 450 as defined by the first surface 505 and the second surface 510 of the leveling reference plate 450 may be greater than the height of the pair of protrusions 612. Accordingly, the pair of protrusions 612 may not extend beyond the second surface 510 of the leveling reference plate 450, and thus may not touch the top surface 912 of the pedestal 910 to prevent any damage to the pedestal 910.

Because the first surface 614 of the cylindrical body 610 of the zero setter 460 may rest on and be in direct contact with the first surface 505 of the leveling reference plate 450, and because the first surface 505 of the leveling reference plate 450 may be parallel or substantially parallel to the top surface 912 of the pedestal 910, the first surface 614 of the cylindrical body 610 may be parallel or substantially parallel to the top surface 912 of the pedestal 910. Because the first surface 632 of the plate member 630 may be controlled to be parallel or substantially parallel to the first surface 614 of the cylindrical body 610, the first surface 632 of the plate member 630 may be parallel or substantially parallel to the top surface 912 of the pedestal 910.

At operation 825, the set of first gauges 420, also referred to as the set of leveling gauges 420, may be zeroed using the zero setter 460 as shown in FIG. 9E. When the zero setter 460 may be placed on the leveling reference plate 450, the spindle 424 of each of the set of first gauges 420 may be compressed by the first surface 632 of the plate member 630 of the zero setter 460. The zero setter 460 may be held in place by its weight or other mechanism so as to maintain the parallelism between the first surface 632 of the plate member 630 and the first surface 505 of the leveling reference plate 450. While the spindles 424 may be compressed by the zero setter 460, the set of first gauges 420 may be zeroed with respect to the first surface 632 of the plate member 630 of the zero setter 460. Because the first surface 632 of the plate member 630 may be parallel or substantially parallel to the top surface 912 of the pedestal 910, once the set of first gauges 420 may be zeroed, measurements made thereafter may indicate relative distances between measured points and the top surface 912 of the pedestal 910. The difference among the readings by the set of first gauges 420 may indicate a degree of parallelism between the top surface 912 of the pedestal 910 and a plane defined by the measured points. After zeroing the set of first gauges 420, the zero setter 460 may be removed.

At operation 830, the gauge spindle compressor 470 may be placed on the pumping channel 930 as shown in FIG. 9F. Referring back to FIG. 9C, the set of second gauges 430 may be mounted on the gauge mounting block 410 such that the measuring tips 436 of the set of second gauges 430 may be positioned above the pumping channel 930. Specifically, the measuring tips 436 may extend radially further outward than an inner surface of the pumping channel 930 but may not extend radially beyond an outer surface of the pumping channel 930. Consequently, when the gauge spindle compressor 470 may be positioned onto the pumping channel 930 as shown in FIG. 9F, the spindles 434 of the set of second gauges 430 may be compressed gradually by the tapered inner surface 720 as the rollers of the measuring tips 436 may glide along the tapered inner surface 720 of the gauge spindle compressor 470. By compressing the spindles 434 of the set of second gauges 430, the length of the spindles 434 may be reduced for subsequent entry into a region defined by a spacer ring 940 of the processing chamber as shown in FIG. 9G.

As shown in FIG. 9F, an outer diameter of the gauge spindle compressor 470 as defined by the outer surface 718 of the gauge spindle compressor 470 may be substantially the same as or similar to an inner diameter of the chamber body 920 defined by the portion of the inner surface of the chamber body 920 that may surround the gauge spindle compressor 470. Consequently, the gauge spindle compressor 470 may not shift relative to the pumping channel 930 when the gauge spindle compressor 470 may compress the spindles 434 of the second gauges 430. To facilitate the entry into the region defined by the spacer ring 940, the non-tapered surface portion 722 of the gauge spindle compressor 470 may be configured with an inner diameter such that the non-tapered surface portion 722 may be aligned with an inner surface of the spacer ring 940 as shown in FIG. 9G. The rollers of the measuring tips 436 of the set of second gauges 430 may also prevent the measuring tips 436 from being caught in the gap between the spacer ring 940 and the gauge spindle compressor 470. Once the gauge spindle compressor 470 may be placed on the pumping channel 930 inside the chamber body 920, the lid stack may be closed, and the chamber may be pumped down to vacuum.

Figure 9G:
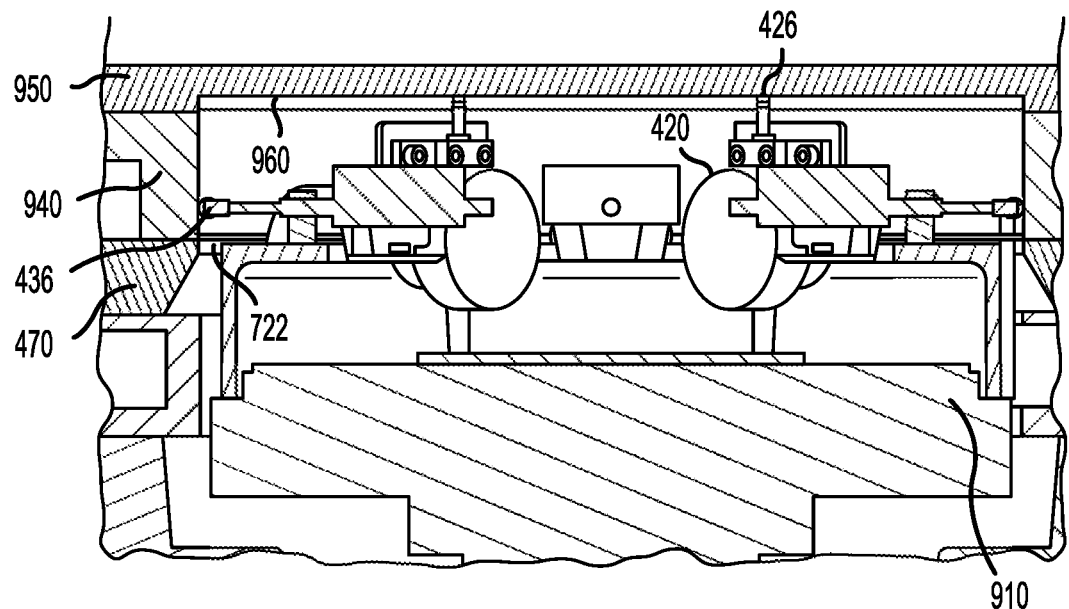
Figure 9H:
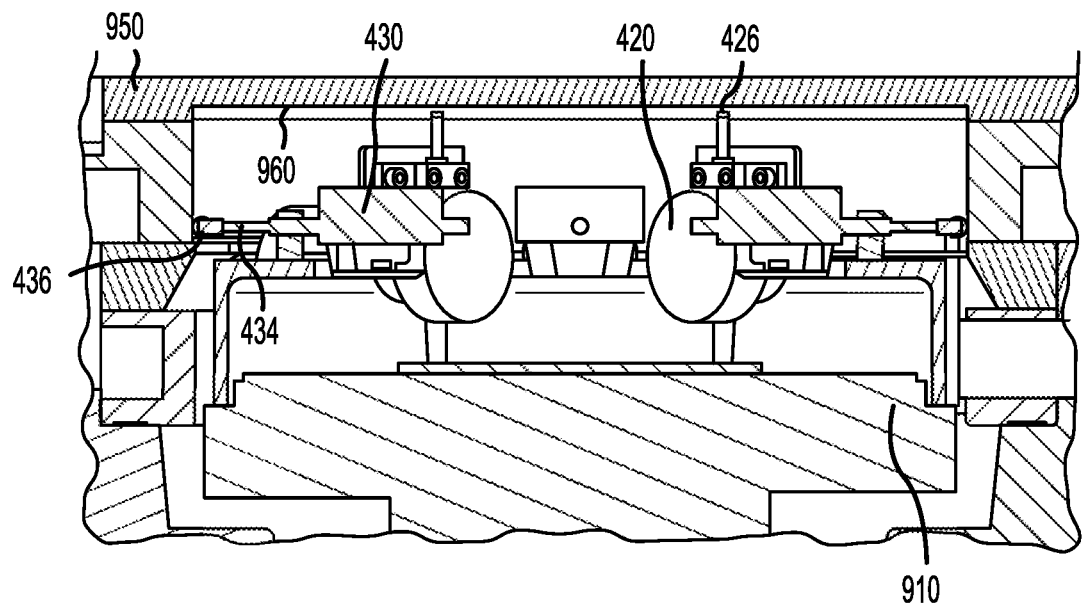

At operation 835, the pedestal 910 may be raised or translate upward such that the measuring tips 426 of the set of first gauges 420 may contact and be compressed by a plate member 950 in the lid stack as shown in FIG. 9G, and the pedestal 910 may be leveled based on measurements by the set of first gauges 420. As discussed above, the measuring tips 426 of the set of first gauges 420 may be flat to ensure that they may not enter into any apertures defined by the plate member 950, but may press against a bottom surface 960 of the plate member 950. The plate member 950 may be the lowest positioned plate member 950 in the lid stack. Depending on the chamber configuration, the plate member 950 may be or include a gas distribution member or plate, such as a faceplate, showerhead, or other gas distribution assembly. At operation 835, the set of second gauges 430 may also enter into the region defined by the spacer ring 940 of the lid stack.

As discussed above, the difference among the measurements or readings by the set of first gauges 420 may indicate a degree of parallelism between the top surface 912 of the pedestal 910 and a plane defined by the measured points. When the gauge spindles 424 may be compressed by the bottom surface 960 of the plate member 950, the difference among the measurements by the set of first gauges 420 may indicate a degree of parallelism between the top surface 912 of the pedestal 910 and the bottom surface 960 of the plate member 950. The measurements or readings may be transmitted wirelessly or via wired connections to a remote device, such as mobile phone, tablet, laptop, and so on, outside the chamber. An operator may then adjust the orientation and/or tilt of the pedestal 910 using levelling adjustment screws of the pedestal 910 until all readings obtained by the set of first gauges 420 may read the same, indicating the top surface 912 of the pedestal 910 may be parallel or substantially parallel to the bottom surface 960 of the plate member 950. Accordingly, the pedestal 910 or the top surface 912 thereof may be leveled with respect to the plate member 950 or the bottom surface 960 thereof.

Once the pedestal 910 may be leveled, the pedestal 910 may be lowered to create a gap or clearance between the measuring tips 436 of the set of second gauges 430 and the bottom surface 960 of the plate member 950 as shown in FIG. H, while the measuring tips 436 of the set of second gauges 430 may still press against the inner surface of the spacer ring 940. With this clearance, the bottom surface 960 may be protected from being scratched by movement of the gauge mounting block 410 and/or the measuring tips 436 of the set of second gauges 430 during the subsequent centering operation 840 based on the readings from the set of second gauges 430.

At operation 840, the pedestal 910 may be centered based on the readings from the set of second gauges 430, which may be transmitted wirelessly or via wired connections outside the chamber to the remote device. As discussed above, the set of second gauges 430 may include four second gauges 430, spaced apart by 90 degrees. Stated differently, the set of second gauges 430 include two pairs of diagonally positioned second gauges 430. As also discussed above, the readings or measurements by second gauges 430 may be indicative of the relative distances between the measured points and the central axis of the pedestal 910. Consequently, when the operator adjust the centering adjustment screws of the pedestal 910 so that the readings of two diagonally opposite second gauges 430 may be adjusted to be the same, the pedestal 910 may be centered or co-axially aligned with the spacer ring 940 in the lid stack.

In some embodiments, the pedestal 910 may include four centering adjustment screws. Each of the four second gauges 430 may be substantially vertically aligned with one of the four centering adjustment screws. Such vertical alignment between the centering adjustment screws and the set of second gauges 430 may result in a direct correspondence between changes in the readings of the second gauges 430 and adjustments made by the screws, which can be easier for an operator to center the pedestal 910. However, any appropriate number of the second gauges 430 may be employed, and the second gauges 430 may not be aligned with the centering adjustment screws of the pedestal 910.

Once the pedestal 910 may be centered and/or leveled, the pedestal 910 may be lowered. The pressure of the processing chamber may be brought to atmosphere, and the lid stack may be opened. The gauge mounting block 410, the gauge spindle compressor 470, and the leveling reference plate 450 may be removed from the processing chamber, and the pumping liner may be placed back inside the processing chamber.

Testing has shown that once a pedestal of a processing chamber may be centered and/or leveled using the apparatus 400 and/or method 800 described herein, the axial alignment between the pedestal and lid stack components and/or the parallelism between the pedestal and the lid stack components may be maintained, even though the chamber may be opened to remove the apparatus 400. Although the centering and/or leveling operations may be performed under vacuum, the centering and/or leveling operations may also be performed without reducing the pressure inside the chamber, such as under atmospheric conditions.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An apparatus, comprising:
an annular mounting block having a central axis, a sidewall about the central axis, and a mounting platform extending radially inward from the sidewall toward the central axis;
a plurality of first gauges mounted on the mounting platform such that the plurality of first gauges are oriented substantially parallel to the central axis, the plurality of first gauges configured to obtain a first plurality of measurements indicative of relative distances between a plane that is substantially perpendicular to the central axis of the annular mounting block and measured points; and
a plurality of second gauges mounted on the mounting platform such that the plurality of second gauges are oriented substantially perpendicular to the central axis and a measuring tip of each second gauge of the plurality of second gauges extends radially beyond the sidewall of the annular mounting block, the plurality of second gauges configured to obtain a second plurality of measurements indicative of relative distances between the central axis of the annular mounting block and measured points.

2. The apparatus of claim 1, wherein the plurality of first gauges comprise at least three dial gauges, and wherein the plurality of second gauges comprise at least three dial gauges.

3. The apparatus of claim 1, wherein a measuring tip of each first gauge of the plurality of first gauges comprises a flat tip, and wherein the measuring tip of each second gauge of the plurality of second gauges comprises a roller tip.

4. The apparatus of claim 1, wherein the sidewall of the annular mounting block is characterized by a plurality of reference surfaces, wherein each reference surface of the plurality of reference surfaces is substantially parallel to the central axis of the annular mounting block and positioned at an equal distance from the central axis of the annular mounting block, and wherein each second gauge of the plurality of second gauges is mounted above one reference surface of the plurality of reference surfaces such that the measuring tip of each second gauge of the plurality of second gauges extends radially beyond the reference surface of the plurality of reference surfaces below.

5. The apparatus of claim 1, further comprising a reference plate having a raised portion characterized by a flat surface, wherein the reference plate is releasably attached to the mounting platform of the annular mounting block, wherein the annular mounting block defines a recess such that, when the reference plate is attached to the annular mounting block, the raised portion of the reference plate is received within the recess of the annular mounting block, and the flat surface faces a floor of the recess and is suspended from the floor of the recess.

6. The apparatus of claim 1, further comprising a gauge spindle compressor positionable about the central axis of the annular mounting block and defining a tapered inner surface, wherein the tapered inner surface is configured to compress a gauge spindle of each second gauge of the plurality of second gauges when the gauge spindle compressor is positioned about the central axis of the annular mounting block and the annular mounting block translates along the central axis of the annular mounting block.

7. The apparatus of claim 1, further comprising:
a leveling reference plate characterized by:
a first surface;
a second surface opposite to the first surface; and
a plurality of openings;
a zero setter comprising:
a cylindrical body having a plurality of protrusions extending from a first surface of the cylindrical body, wherein each protrusion of the plurality of protrusions of the zero setter is configured to be received in an opening of the plurality of openings of the leveling reference plate, and wherein each protrusion of the plurality of protrusions is characterized by a height dimension less than a thickness dimension of the leveling reference plate defined by the first surface and the second surface of the leveling reference plate such that the plurality of protrusions do not extend beyond the second surface of the leveling reference plate when the plurality of protrusions of the zero setter are received in the plurality of openings of the leveling reference plate; and
a plate member supported by the cylindrical body, wherein when the plurality of protrusions of the zero setter are received in the plurality of openings of the leveling reference plate, the zero setter is supported by the leveling reference plate such that a first surface of the plate member of the zero setter is parallel to the first surface of the leveling reference plate.

8. A method comprising:
collecting, via a plurality of first dial gauges, a first set of measurements indicative of relative distances between a plurality of locations at a gas distribution member of a semiconductor processing chamber and a top surface of a pedestal of the semiconductor processing chamber; and
adjusting the pedestal to a first position based on the first set of measurements such that the top surface of the pedestal is substantially parallel to a bottom surface of the gas distribution member.

9. The method of claim 8, further comprising:
reducing a pressure inside the semiconductor processing chamber toward vacuum prior to collecting the first set of measurements.

10. The method of claim 8, further comprising:
raising the pedestal to position a flat tip of a gauge spindle of each first dial gauge of the plurality of first dial gauges in contact with the bottom surface of the gas distribution member.

11. The method of claim 8, further comprising:
zeroing the plurality of first dial gauges with respect to the top surface of the pedestal.

12. The method of claim 8, further comprising:
collecting, via a plurality of second dial gauges, a second set of measurements indicative of relative distances between a plurality of locations at a ring member of the semiconductor processing chamber and a central axis of the pedestal; and
adjusting the pedestal to a second position based on the second set of measurements such that the central axis of the pedestal and a central axis of the ring member are aligned.

13. The method of claim 12, further comprising:
placing a gauge spindle compressor inside a chamber body of the semiconductor processing chamber, wherein the gauge spindle compressor comprises a tapered inner surface; and raising the pedestal to cause a roller tip of a gauge spindle of each second dial gauge of the plurality of second dial gauges to slide along the tapered inner surface and pass the tapered inner surface until the roller tip of the gauge spindle of each second dial gauge of the plurality of second dial gauges is positioned against an inner surface of the ring member of the semiconductor processing chamber.

14. The method of claim 12, wherein the plurality of first dial gauges and the plurality of second dial gauges are mounted on a mounting block, the method further comprising:

placing the mounting block around the pedestal, wherein the mounting block comprises a plurality of protrusions to be received inside a plurality of recesses at the pedestal such that, when the mounting block is placed around the pedestal, a central axis of the mounting block and the central axis of the pedestal are aligned.

15. An apparatus comprising:

a gauge mounting block;

a plurality of first gauges mounted on the gauge mounting block, the plurality of first gauges configured to obtain measurements indicative of a degree of parallelism between a first component of a lid stack of a semiconductor processing chamber and a pedestal of the semiconductor processing chamber; and a plurality of second gauges mounted on the gauge mounting block, the plurality of second gauges configured to obtain measurements indicative of a degree of axial alignment between a second component of the lid stack and the pedestal.

16. The apparatus of claim 15, wherein the semiconductor processing chamber further comprises a chamber body, wherein the lid stack is configured to be opened and closed relative to the chamber body such that a pressure inside the semiconductor processing chamber can be reduced toward vacuum when the lid stack is closed, wherein the plurality of first gauges are configured to obtain the measurements indicative of the degree of parallelism between the first component of the lid stack and the pedestal under vacuum, and wherein the plurality of second gauges are configured to obtain the measurements indicative of the degree of axial alignment between the second component of the lid stack and the pedestal under vacuum.

17. The apparatus of claim 15, wherein the gauge mounting block include a central axis, a sidewall about the central axis, and a mounting platform extending radially inward from the sidewall toward the central axis, wherein the plurality of first gauges and the plurality of second gauges are mounted on the mounting platform, and wherein the plurality of second gauges are oriented substantially perpendicular to the plurality of first gauges.

18. The apparatus of claim 15, further comprising a gauge spindle compressor configured to be positioned about a central axis of the pedestal, wherein the gauge spindle compressor comprises a tapered inner surface configured to engage and compress a roller tip of each second gauge of the plurality of second gauges.

19. The apparatus of claim 15, wherein the first component of the lid stack comprises a plate member, and wherein the degree of parallelism is determined between a lower surface of the plate member and an upper surface of the pedestal.

20. The apparatus of claim 15, wherein the second component of the lid stack comprises a ring member.

* * * * *